US012598741B2

(12) United States Patent
Nevers et al.

(10) Patent No.: US 12,598,741 B2
(45) Date of Patent: Apr. 7, 2026

(54) MULTI-STACK BITCELL ARCHITECTURE

(71) Applicant: Arm Limited, Cambridge (GB)

(72) Inventors: Yannick Marc Nevers, Châteauneuf-Grasse (FR); Valerio Lanieri, Antibes (FR); Amit Chhabra, Delhi (IN)

(73) Assignee: Arm Limited, Cambridge (GB)

( * ) Notice: Subject to any disclaimer, the term of this patent is extended or adjusted under 35 U.S.C. 154(b) by 525 days.

(21) Appl. No.: 18/103,316

(22) Filed: Jan. 30, 2023

(65) Prior Publication Data

US 2024/0260261 A1 Aug. 1, 2024

(51) Int. Cl.
*G11C 11/34* (2006.01)
*H10B 20/00* (2023.01)

(52) U.S. Cl.
CPC ............. *H10B 20/50* (2023.02); *H10B 20/34* (2023.02)

(58) Field of Classification Search
CPC ................................ H10B 20/50; H10B 20/34
USPC ...................................................... 365/185.01
See application file for complete search history.

(56) References Cited

U.S. PATENT DOCUMENTS

| | | | | | |
|---|---|---|---|---|---|
| 11,450,686 | B2 * | 9/2022 | Yeong | .................... | H10D 30/62 |
| 11,488,969 | B1 * | 11/2022 | Liaw | ................. | H10D 30/6729 |
| 11,495,499 | B2 * | 11/2022 | Chhabra | ................ | H10D 88/00 |
| 11,527,539 | B2 * | 12/2022 | Hsu | .......................... | G11C 7/12 |
| 11,545,497 | B2 * | 1/2023 | Chanemougame | .......................... | |
| | | | | | H10D 84/0167 |
| 11,729,962 | B2 * | 8/2023 | Lee | ...................... | H10D 62/151 |
| 11,895,816 | B2 * | 2/2024 | Chhabra | .............. | H10D 84/038 |
| 11,903,189 | B2 * | 2/2024 | Young | .................... | G11C 16/24 |
| 11,991,887 | B2 * | 5/2024 | Wang | .................... | H10B 51/20 |
| 12,279,419 | B2 * | 4/2025 | Sakai | ..................... | G11C 17/12 |
| 12,284,797 | B2 * | 4/2025 | Liaw | ...................... | H10D 30/43 |
| 12,317,468 | B2 * | 5/2025 | Liaw | .................... | H01L 23/528 |
| 2010/0177544 | A1 | 7/2010 | Nevers et al. | | |
| 2024/0224536 | A1 * | 7/2024 | Sharma | ................. | H10B 51/30 |

* cited by examiner

*Primary Examiner* — Viet Q Nguyen
(74) *Attorney, Agent, or Firm* — Pramudji Law Group PLLC; Ari Pramudji

(57) ABSTRACT

Various implementations described herein are related to a device having a memory architecture with a multi-stack of transistors that may be arranged in a multi-bitcell stack configuration. Also, the memory architecture may have a wordline that may be shared across the transistors of the multi-stack of transistors with each transistor coupled to a different bitline.

20 Claims, 33 Drawing Sheets

600B

Vertical Stack Bitcell Architecture (Left-Side View) 504B

100A

Bitcell Architecture 104A

BC Layout

| X (diff) | WL (gate) | Y (diff) |
| --- | --- | --- |

100B

Bitcell Architecture  104B

Coded Bit = Logic 1

Coded Bit = Logic 0

Coded Bit = Logic 1

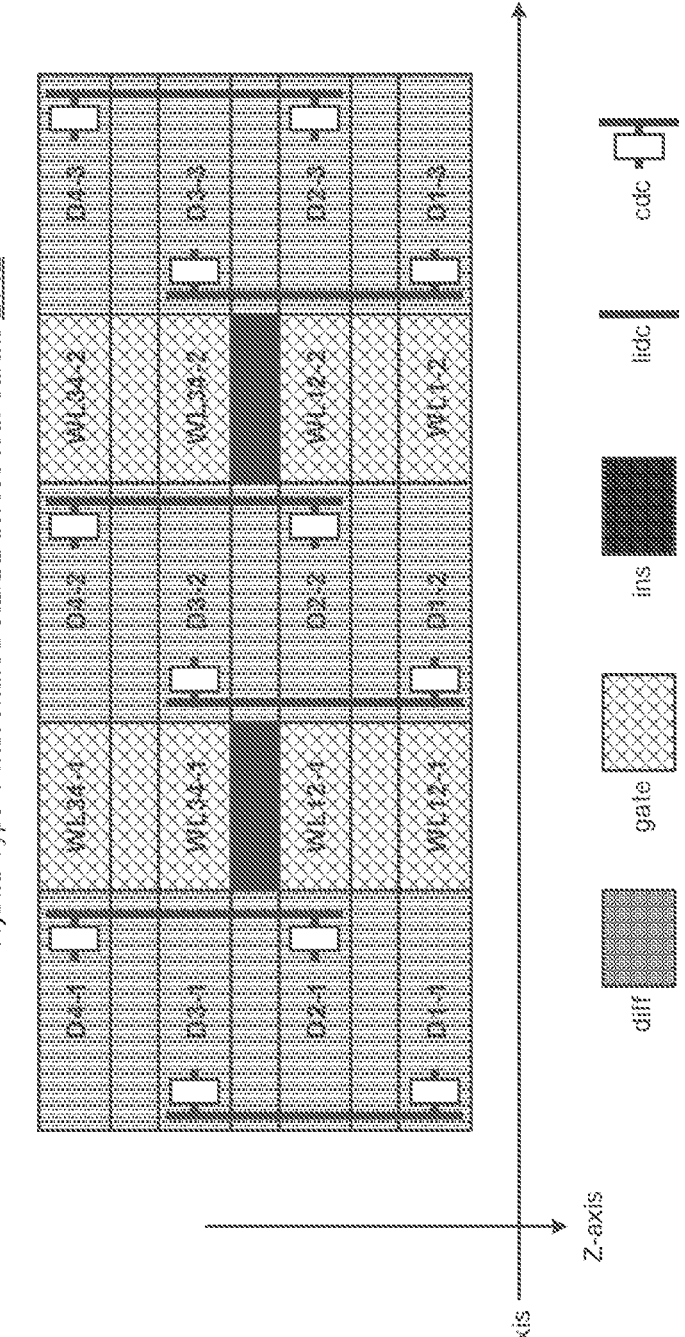

Multi-Stack Bitcell Architecture 204E

Hybrid Type 1 with shared WL/BL across four-stacks 214E diff     gate     ins     lidc     cdc D1[2]-[N] is the drain connection where:
    The number 1, 2 represent the stack number from the bottom.
    If one number written, then it means only 1 stack. If more than one number written, then it means all numbers combined.
    N represents the index.
This connection can either be VSS or BL depending on code programing.

Z-axis

X-axis

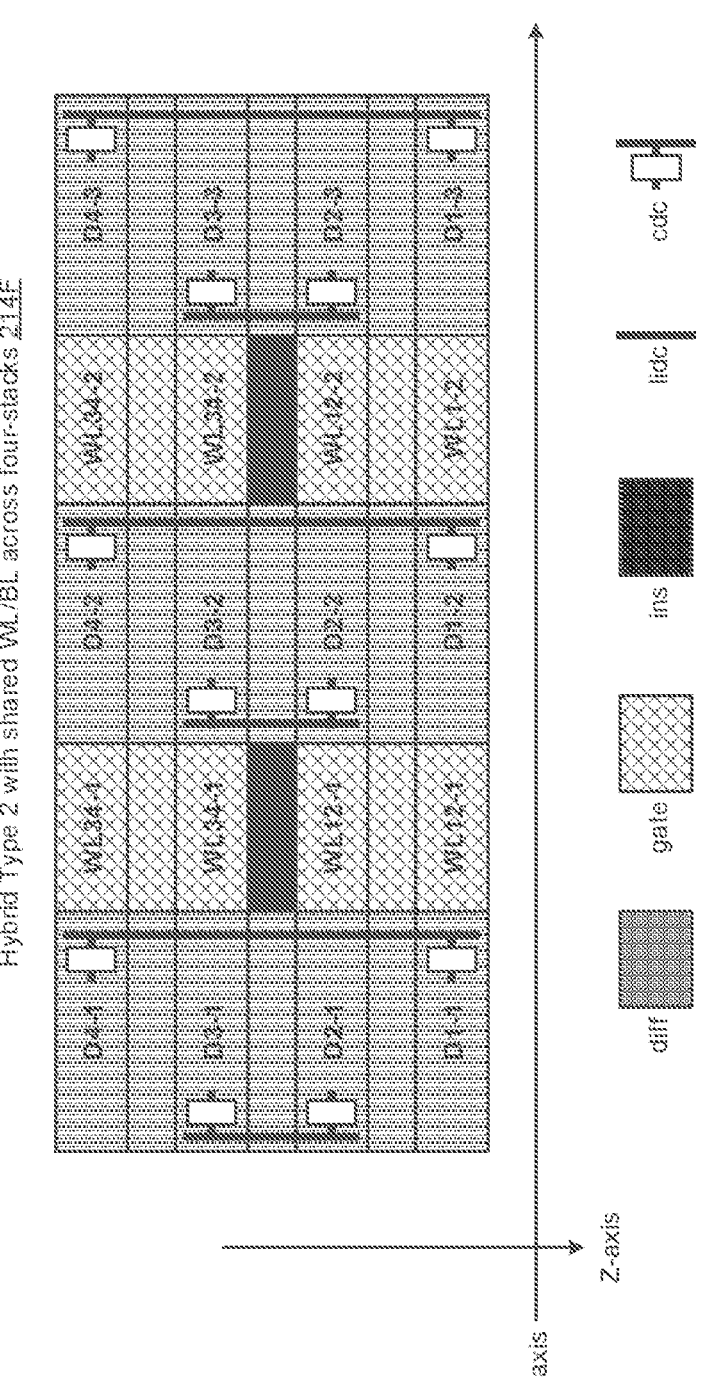

Multi-Stack Bitcell Architecture 204F

Hybrid Type 2 with shared WL/BL across four-stacks 214F

200F

X-axis

Z-axis diff    gate    ins    iidc    cdc

D[1][2]-[N] is the drain connection where:

The number 1, 2 represent the stack number from the bottom.

If one number written, then it means only 1 stack. If more than one number written, then it means all numbers combined.

N represents the index.

This connection can either be VSS or BL depending on code programming.

P-over-N Multi-Device Stack Common-Gate Architecture 304A

300B

P-over-N Multi-Device Stack Split-Gate Architecture 304B

300C

N-over-P Multi-Device Stack Common-Gate Architecture 304C

300D

N-over-P Multi-Device Stack Split-Gate Architecture 304D

300E

N-over-N Multi-Device Stack Common-Gate Architecture 304E

300F

N-over-N Multi-Device Stack Split-Gate Architecture 304F

300G

P-over-P Multi-Device Stack Common-Gate Architecture 304G

300H

P-over-P Multi-Device Stack Split-Gate Architecture 304H

400A

PNNP Multi-Device Stack Common-Gate Architecture 404A

PFET_NS_2

NFET_NS_2

GATE_C2

NFET_NS_1

PFET_NS_1

GATE_C1

400B

PNNP Multi-Device Stack Split-Gate Architecture 404B

400C

NPPN Multi-Device Stack Common-Gate Architecture 404C

400D

NPPN Multi-Device Stack Split-Gate Architecture 404D

400E

NNNN Multi-Device Stack Common-Gate Architecture 404E

400F

NNNN Multi-Device Stack Split-Gate Architecture 404F

NFET_NS_4

GATE_4

NFET_NS_3

GATE_3

NFET_NS_2

GATE_2

NFET_NS_1

GATE_1

400G

PPPP Multi-Device Stack Common-Gate Architecture 404G

400H

PPPP Multi-Device Stack Split-Gate Architecture 404H

PFET_NS_4

GATE_4

PFET_NS_3

GATE_3

PFET_NS_2

GATE_2

PFET_NS_1

GATE_1

400I

NNPP Multi-Device Stack Common-Gate Architecture 404I

PFET_NS_2

PFET_NS_1

GATE_C2

NFET_NS_2

NFET_NS_1

GATE_C1

400J

NNPP Multi-Device Stack Split-Gate Architecture 404J

400K

PNPN Multi-Device Stack Common-Gate Architecture 404K

400L

PNPN Multi-Device Stack Split-Gate Architecture 404L

NFET_NS_2

GATE_4

PFET_NS_2

GATE_3

NFET_NS_1

GATE_2

PFET_NS_1

GATE_1

400M

PPNN Multi-Device Stack Common-Gate Architecture 404M

400N

PPNN Multi-Device Stack Split-Gate Architecture 404N

400O

NPNP Multi-Device Stack Common-Gate Architecture 404O

400P

NPNP Multi-Device Stack Split-Gate Architecture 404P

Vertical Stack Bitcell Architecture (Right-Side View) 504A

MULTI-STACK BITCELL ARCHITECTURE

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

In some modern circuit architecture, conventional transistor based devices use traditional layout techniques and thus suffer from low density design application that may typically cause unintended consequences in fabrication processes. Therefore, traditional layout techniques can be inefficient, density deficient and typically fail to provide sufficient means for implementing various different layout configurations. Thus, there exists a need to improve traditional layout techniques that allow for efficient device fabrication.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

FIGS. 2A-2F illustrate various diagrams of multi-stack bitcell architecture in accordance with various implementations described herein.

DETAILED DESCRIPTION

Figure 1A:
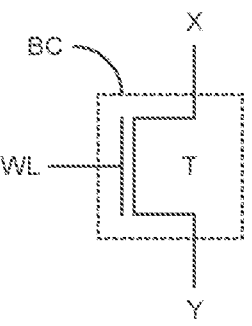
FIGS. 1A-1C illustrate various diagrams of bitcell architecture in accordance with various implementations described herein.
Figure 1A:
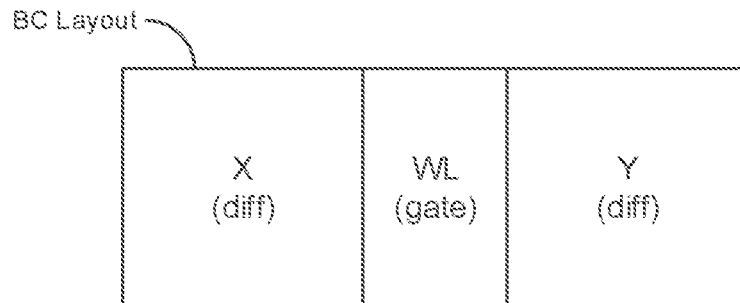

Various implementations described herein are directed to fabrication schemes and techniques for multi-device stack architecture in physical layout designs for various circuit related applications. In some implementations, the multi-device stack architecture may provide for highly dense read-only memory (ROM) programming solutions for three-dimensional (3D) technologies. Further, various physical layout schemes and techniques described herein may provide for multi-transistor stacked device fabrication techniques for manufacturing on a single monolithic wafer or in a sequential manner. As such, using various physical layout schemes and techniques described herein may provide for bitcells that allow sharing of source/drains of multi-device stacks of transistors with other devices on a same bitline. As such, various concepts described herein may provide a substantially improved area gain, and various concepts described herein may enable an improvement in overall performance, because bitlines may be shorter, and because programming may be optimized by lowering bitline capacitance.

Also, various schemes and techniques described herein may rearrange bitcells so that each global-horizontal bitline may be locally coupled to multiple vertical bitlines in a manner that transistors may share their drain with their neighbor, such as, e.g., upper and/or under neighbors. As such, bitcells may be programmed vertically with transistors disposed on the same bitline. In some instances, this means that all vertical lines on the same bitline may be coupled to an upper bitline, such as, e.g. a global bitline. Also, in this instance, this implementation may result in a highly dense ROM core array, such that the transistors are sharing both drains with upper and under neighbors. Also, this implementation may be independent of the number of devices the technology will support, and this implementation may or may not use buried power rails (e.g., VSS ground rails) that may be targeted in these technologies.

In various implementations, there are multiple different ways of building device architecture for stacked transistors. For instance, one way is to build stacked transistors in a monolithic fashion, which refers to using a single wafer with 2 or 4 sets of nanosheets for processing the wafer. In another instance, another way is to build stacked transistors in a sequential fashion, wherein one device stack is processed first, followed by another layer of device stack using a substantially thinned wafer. These multiple methods provide flexibility in managing various different devices in the stack in terms of threshold voltage, gate connections, etc. Therefore, stacked devices may be manufactured using various fabrication schemes and techniques described herein, including monolithic (monolithically formed stacks) and sequential (sequentially formed stacks).

Various implementations described herein are directed to fabrication schemes and techniques for multi-transistor stack architectures in various physical layout designs for multi-device applications. For instance, various fabrication schemes and techniques described herein provide for various hybrid device stacking techniques for complementary field effect transistor (FET) technologies, and therefore, aspects of the present disclosure are associated with a novel device stack architecture arrangement for complementary FET (CFET) technologies and related applications. Also, the various fabrication schemes and techniques described herein may provide for a method of manufacture using hybrid technologies wherein multiple device stacks are fabricated together in a single monolithic semiconductor die. In other instances, multi-transistor stacks may be formed, fabricated or manufactured in a sequential manner. In some applications, N-over-P stacked devices and P-over-N stacked devices may be co-manufactured on a single wafer, and N-over-N stacked devices and P-over-P stacked devices refer to variants that are simultaneously manufactured along with N-over-P stacked devices and/or P-over-N stacked devices in the same, single monolithic semiconductor die or wafer or in a sequential manner.

In some implementations, multi-transistor fabrication schemes and techniques described herein may utilize novel technology that supports complementary FET (CFET) devices, wherein each device may be fabricated with nanosheets (NS) or Fin-FET (FF) that are used to form multiple devices in multi-transistor stacks within a single monolithic semiconductor die with multiple devices stacked on top of each other. In other instances, the multi-transistor CFET device stacks may be formed, fabricated or manufactured in a sequential manner. Also, various fabrication schemes and techniques described herein may provide for multiple complementary stack configurations, such as, e.g., an NN based structure having an N-over-N stack configuration and a PP based structure having a P-over-P stack configuration. In some instances, gates for PFET devices and NFET devices may use common-gate and/or split-gate architecture in multi-device stack configurations. Also, the multi-transistor fabrication schemes and techniques described herein may utilize technology that supports N-over-P devices along with P-over-N devices as additional stack configurations that are fabricated with N-over-N and P-over-P stack configurations within a single monolithic semiconductor die in various multi-transistor stack applications. Also, in other applications, N-over-P stacked devices and P-over-N stacked devices may be formed, fabricated or manufactured in a sequential manner.

In some implementations, the various multi-transistor fabrication schemes and techniques described herein may provide for other types of multiple complementary stack configurations, such as, e.g., an NNNN based structure having an N-over-N-over-N-over-N stack configuration and a PPPP based structure having a P-over-P-over-P-over-P stack configuration. In various instances, the gates for PFET devices and NFET devices may utilize common-gate and/or split-gate architecture in the other types of multi-device stack configurations. Also, the multi-transistor fabrication schemes and techniques described herein utilize technology that supports N-over-P-over-P-over-N devices along with P-over-N-over-N-over-P devices as in a same vertical stack configurations that may be fabricated with the N-over-N-over-N-over-N and P-over-P-over-P-over-P stack configurations within a same single monolithic semiconductor die in various multi-transistor stack applications and/or configurations. Moreover, various other supported multi-transistor structures may include P-over-P-over-N-over-N, N-over-N-over-P-over-P, P-over-N-over-P-over-N, and N-over-P-over-N-over-P stack configurations. In other implementations, the multi-transistor stacks may be formed, fabricated or manufactured in a sequential manner.

In some implementations, the various multi-transistor fabrication schemes and techniques described herein may provide for other types of multiple stack configurations, such as, e.g., an N-only stack and/or a P-only stack For instance, as described herein, a precharge circuit may be formed with a P-only stack, wherein the P-only stack may include multiple transistors, such as, e.g., 2 or 3 or 4 or more transistors that may be built on top of each other in a multi-transistor stack structure. Also, various other circuits associated with memory architecture may have similar P-only/N-only stack configurations.

Various implementations of providing multi-transistor fabrication schemes and techniques for multi-device stack configurations in circuit architecture applications will be described herein with FIGS. 1A-1C, 2A-2F, 3A-3H, 4A-4P, 5A-5B and 6A-6B.

Figure 1B:
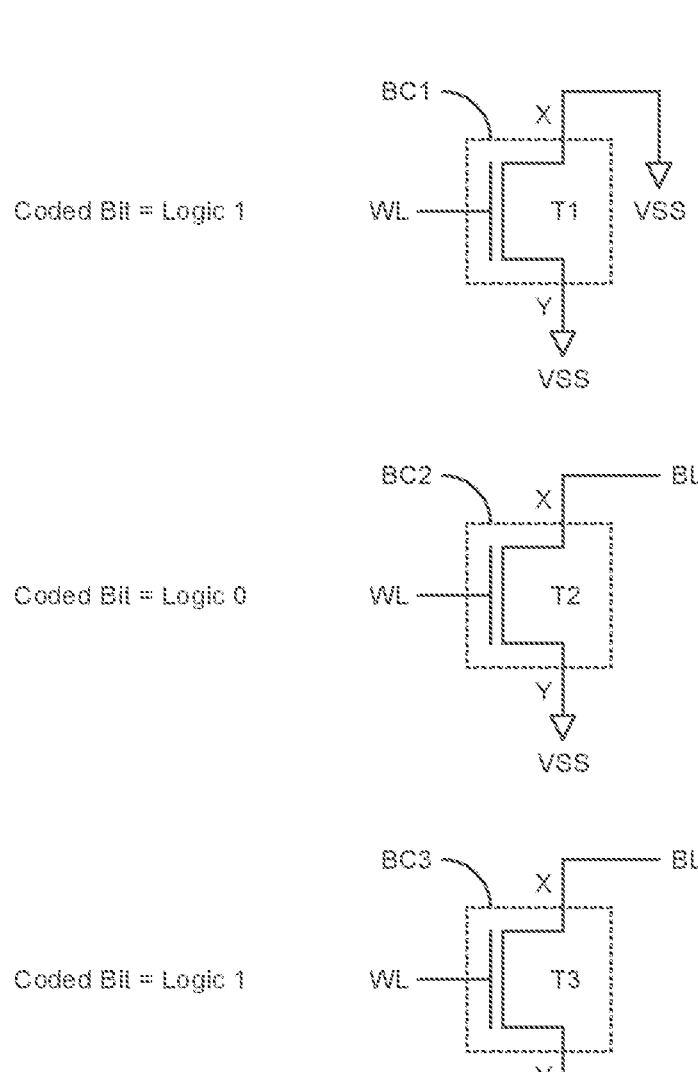
Figure 1C:
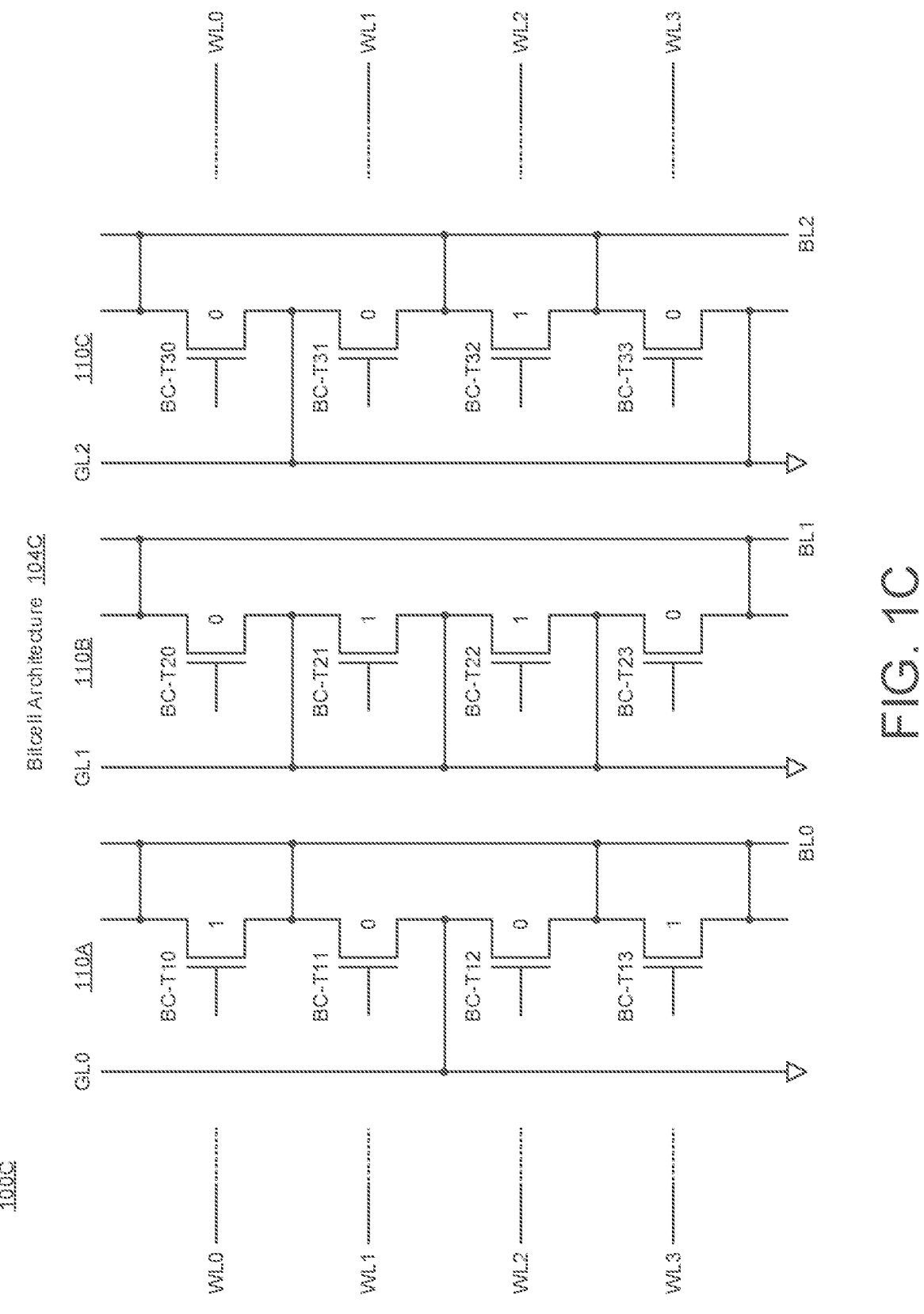

FIGS. 1A-1C illustrate various diagrams of bitcell architecture in accordance with various implementations described herein. In particular, FIG. 1A shows a diagram 100A of bitcell architecture 104A, FIG. 1B shows a diagram 100B of bitcell architecture 104B, and FIG. 1C shows a diagram 1000 of bitcell architecture 104C.

In various implementations, the bitcell architectures may be implemented as a system or a device having various integrated circuit (IC) components that are arranged and coupled together as an assemblage or combination of parts that provide for physical circuit designs and various related structures. In some instances, a method of designing, providing and fabricating the bitcell architectures as an integrated system or device may involve use of various IC circuit components described herein so as to thereby implement fabrication schemes and techniques associated therewith. Also, the bitcell architectures may be integrated with computing circuitry and related components on a single chip, and further, the circuit architectures may also be implemented in various embedded systems for automotive, electronic, mobile, server and Internet-of-things (IoT) applications.

In some implementations, as shown in FIG. 1A, the bitcell architecture 104A may refer to read-only memory (ROM) based bitcell architecture. In various applications, the bitcell architecture 104A may include a bitcell (BC) having at least one transistor (T) with a gate coupled to wordline (WL) and source/drain coupled to nodes (X/Y). In various instances, nodes (X/Y) may be coupled to a bitline (BL) or ground (VSS). Also, in various instances, multiple bitcells (BC) may be coupled in series with each source/drain shared with a neighboring transistor (T) in a neighboring bitcell (BC). Also, FIG. 1A shows a layout view (BC Layout) of the bitcell (BC) with the wordline (WL) coupled to a gate region of the bitcell (BC) and source/drain regions coupled to the nodes (X/Y). Also, in various applications, the nodes (X/Y) may be referred to as a diffusion region (D or diff) that may be coupled to a bitline (BL) or ground (VSS).

In some implementations, as shown in FIG. 1B, the bitcell architecture 104B may include ROM based bitcell architecture arranged in various configurations. Also, in some applications, bit programming may be performed by creating a connection between the bitline (BL) and ground (VSS) or not, so that when the wordline (WL) is activated, then the bitline (BL) is discharged or not affected. Also, various bit programming configurations may be used to encode a logical bit value of logic one (1) or logic zero (0). For instance, in some applications, a '0' (e.g., logic 0) may be bit programmed when the bitcell (BC) discharges the bitline (BL), and also, a '1' (e.g., logic 1) may be bit programmed when the bitcell (BC) does not affect the bitline (BL). Also, in other applications, reverse convention may be used without impacting the arrangement and/or configuration as shown.

In various configurations, the bitcell architecture 104B may include a first bitcell (BC1) having at least one transistor (T1) with a gate coupled to the wordline (WL) and source/drain coupled to ground (VSS) via nodes (X/Y). In reference to bit programming the first bitcell (BC1), when the wordline (WL) is activated, the bitline (BL) is not connected to ground (VSS), and thus, a logic one (1) may be encoded in the bitcell (BC1).

Also, in other configurations, the bitcell architecture 104B may include a second bitcell (BC2) having at least one transistor (T2) with the gate coupled to the wordline (WL) and the source/drain coupled to the bitline (BL) by way of one node (X) and then another source/drain coupled to ground (VSS) by way of another node (Y). Also, in this instance, in reference to bit programming second bitcell (BC2), when the wordline (WL) is activated, the bitline (BL) is connected to ground (VSS), and thus, a logic zero (0) may be encoded in the bitcell (BC2).

Further, in other configurations, the bitcell architecture 104B may include a third bitcell (BC3) having at least one transistor (T3) with the gate coupled to the wordline (WL) and source/drain coupled to bitline (BL) by way of one node (X) and another source/drain coupled to the bitline (BL) by way of another node (Y). Also, in this instance, in reference to bit programming third bitcell (BC3), when the wordline (WL) is activated, the bitcell (BC3) is shorted to itself by way of bitline (BL), and thus, no connection to ground (VSS) is created and a logic one (1) is encoded in the bitcell (BC3).

In some implementations, in reference to FIGS. 1A-1B, transistors (T, T1, T2, T3) may refer to N-type transistors. However, various other configurations may be used (e.g., P-type transistors, or similar) to achieve similar results and/or behaviors, e.g., in the instance of P-type transistors, VSS will be replaced by VDD.

In some implementations, as shown in FIG. 1C, the bitcell architecture 104C may refer to read-only memory (ROM) based bitcell architecture. In various applications, the bitcell architecture 104C may include columns 110A, 110B, 110C of bitcells with each bitcell (BC) having at least one transistor (T). For instance, a first column 110A may have multiple bitcells with each bitcell (BC) having at least one transistor (T10, T11, T12, T13) coupled in series, a second column 110B may have multiple bitcells with each bitcell (BC) having at least one transistor (T20, T21, T22, T23) coupled in series, and a third column 110C may have multiple bitcells with each bitcell (BC) having at least one transistor (T30, T31, T32, T33) coupled in series. In various applications, each bitcell (BC) may include a single transistor; however, in various other applications, each bitcell (BC) have multiple transistors coupled and/or stacked in series. Also, in some instances, multiple wordlines (WL0, WL1, WL2, WL2) may be coupled to gates of corresponding transistors (T) such that, e.g., WL0 is coupled to gates of T10, T20, T30, WL1 is coupled to gates of T11, T21, T31, WL2 is coupled to gates of T12, T22, T32, and WL3 is coupled to gates of T13, T23, T33. Also, in various applications, in reference to planar technologies for FIG. 1C, columns may refer to stack devices, or columns may refer to by bit-cell column.

In reference to bit programming, each bitcell (BC) may be encoded with a logic one (1) or logic zero (0) by way of various programmable and/or configurable connections to corresponding bitlines (BL0, BL1, BL2) and ground lines (GL0, GL1, GL2). In various applications, the first column 110A of bitcells (BC) may be encoded as 1001 by coupling T10 between BL0, by coupling T11 between BL0 and GLA, by coupling T12 between GL0 and BL0, and by coupling T13 between BL0. Also, the second column 110B of bitcells (BC) may be encoded as 0110 by coupling T20 between BL1 and GL1, by coupling T21 between GL1, by coupling T22 between GL1, and by coupling T23 between GL1 and BL1. Also, the third column 110C may be encoded as 0010 by coupling T30 between BL2 and GL2, by coupling T31 between GL2 and BL2, by coupling T32 between BL2, and by coupling T33 between BL2 and GL2.

In some applications, in reference to FIG. 1C, columns 110A and 110C may be programmed in a way so as to minimize capacitance on the bitline (BL). For instance, for column 110A, drains may be coupled on BC-T13 to GL0 so as to program a first bitcell with a logic 1, which may result in a lower number of drains coupled to bitline (BL). Thus, in various applications, programming may depend on the way programming is achieved for the first transistor, e.g., based on selecting the first drain on GL or on BL.

In some implementations, in reference to FIG. 1C, transistors (T10, T11, T12, T13, T20, T21, T22, T23, T30, T31, T32, T33) may refer to N-type transistors. However, various other configurations may be used (e.g., P-type transistors, or similar) to achieve similar results and/or behaviors, e.g., when implementing use of P-type transistors, the ground (VSS) will be replaced by voltage supply source (VDD).

Figure 2A:
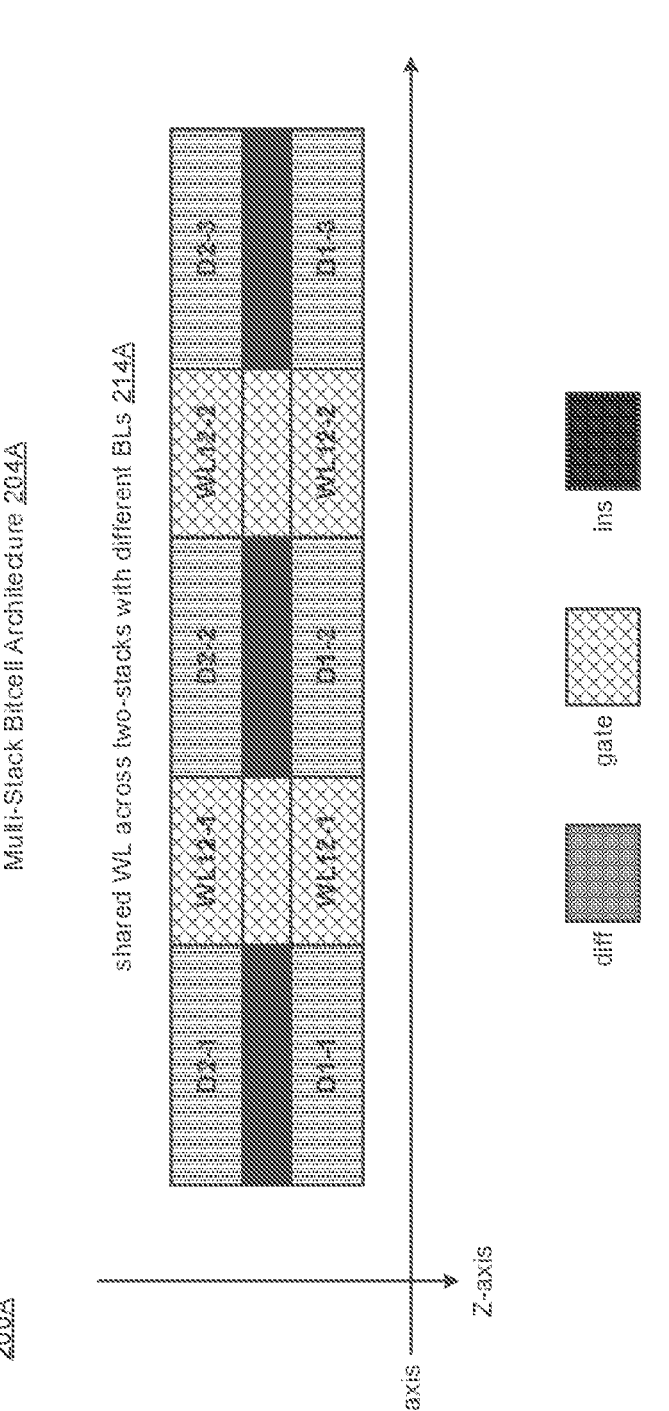
Figure 2B:
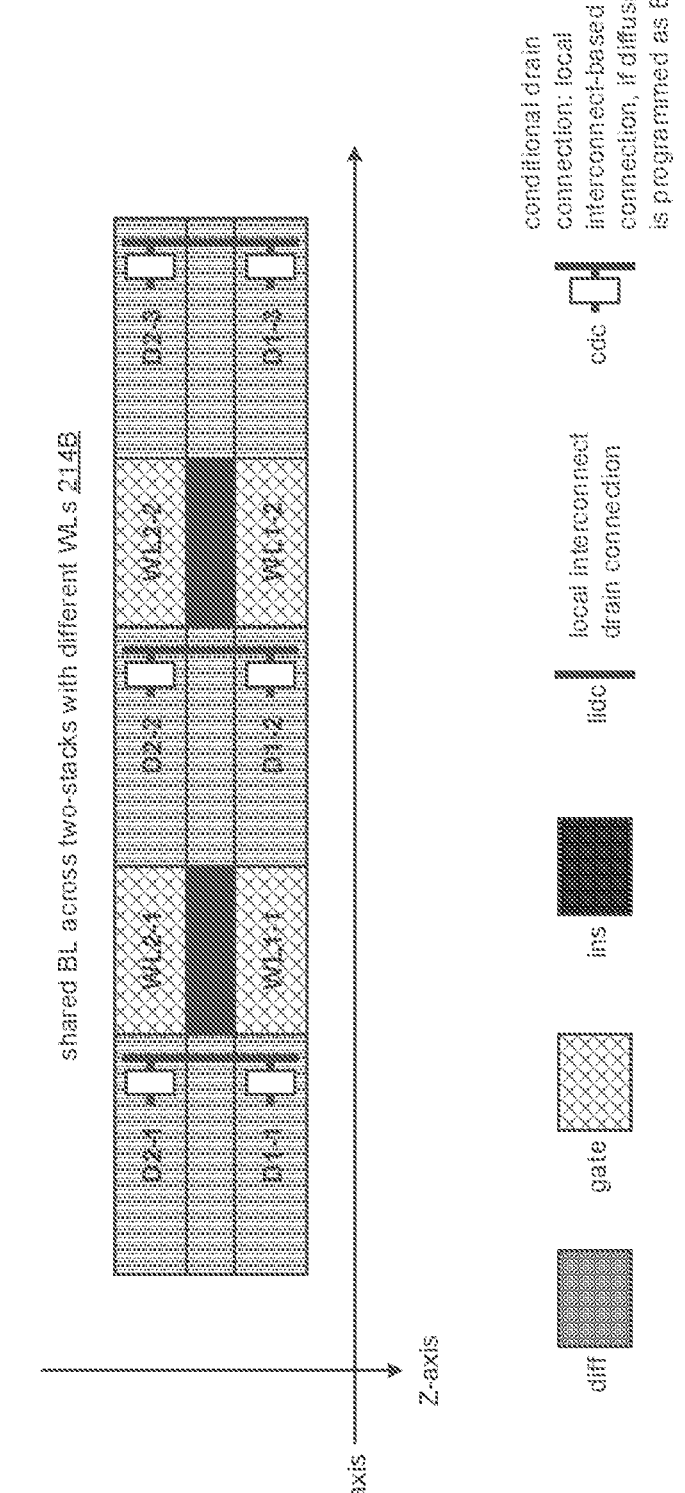
Figure 2C:
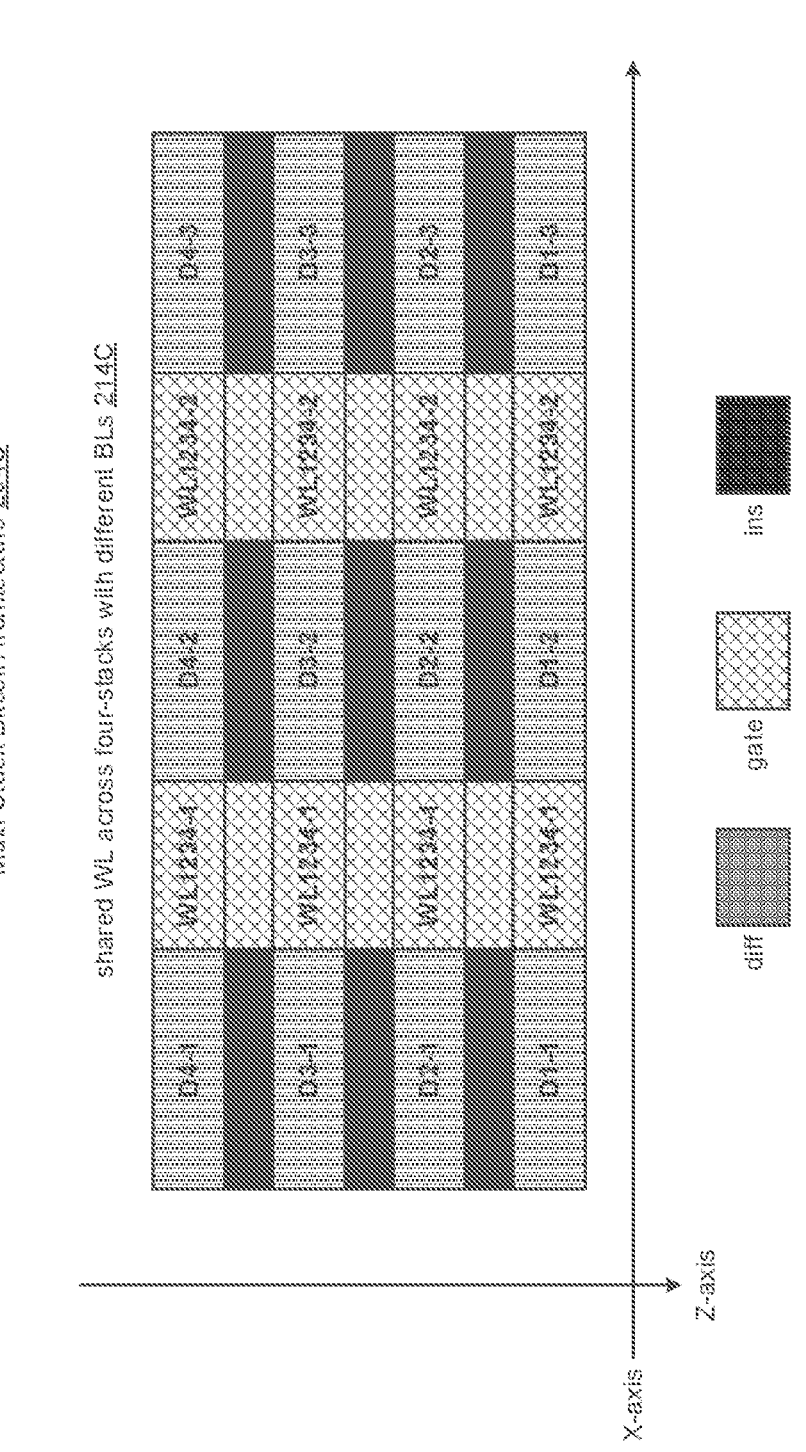
Figure 2D:
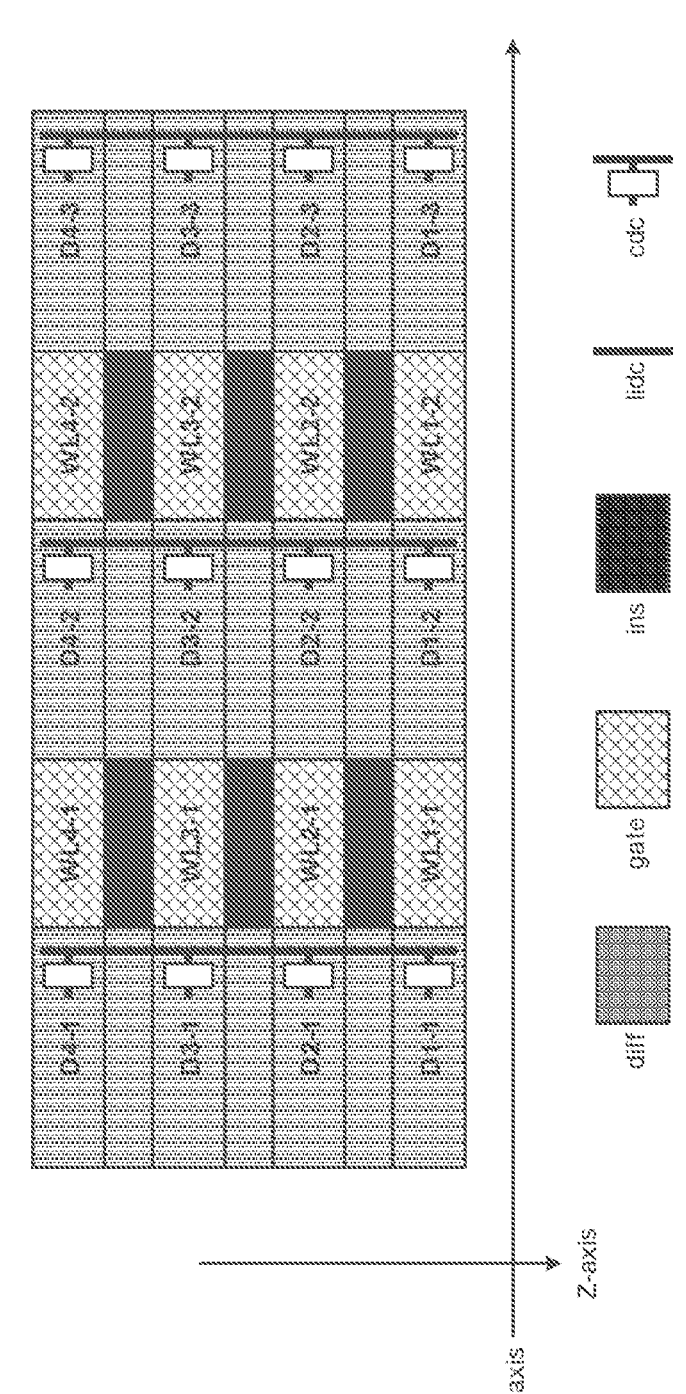

FIGS. 2A-2F illustrate various diagrams of multi-stack bitcell architecture in accordance with various implementations described herein. In particular, FIG. 2A shows a diagram 200A of multi-stack bitcell architecture 204A, FIG. 2B shows a diagram 200B of multi-stack bitcell architecture 204B, FIG. 2C shows a diagram 2000 of multi-stack bitcell architecture 204C, FIG. 2D shows a diagram 200D of multi-stack bitcell architecture 204D, FIG. 2E shows a diagram 200E of multi-stack bitcell architecture 204E, and FIG. 2F shows a diagram 200F of multi-stack bitcell architecture 204F.

In various implementations, multi-stack bitcell architecture may be implemented as a system or device having various integrated circuit (IC) components that are arranged and coupled together as an assemblage or some combination of parts that may provide for physical circuit designs and various related structures. In some instances, a method of designing, providing and fabricating the multi-stack bitcell architecture as an integrated system or device may involve use of various IC circuit components described herein so as to thereby implement fabrication schemes and techniques associated therewith. Also, the multi-stack bitcell architecture may be integrated with computing circuitry and related components on a single chip, and the multi-stack bitcell architecture may be implemented in various embedded systems for automotive, electronic, mobile, server and/or Internet-of-things (IoT) applications, such as, e.g., remote sensor nodes.

As shown in FIG. 2A, the multi-stack bitcell architecture 204A may include a memory architecture with a multi-stack of transistors 214A arranged in a multi-bitcell stack configuration, and a wordline (WL) may be shared across the transistors of the multi-stack of transistors with each transistor coupled to a different bitline (BL) by way of the diffusion regions (D or diff) associated with the bitcell. Also, in some instances, the wordline (WL) may be shared across the transistors by way of the gate regions (gate). Also, in various applications, each individual source/drain belonging to each transistor in a stack may be independently coupled or connected to ground (VSS) or to a bitline (BL).

As described in reference to FIGS. 1A-1C, the diffusion regions (D or diff) may be coupled to a bitline (BL) or ground (VSS), and the gate regions (gate) may be coupled to a wordline (WL). Also, a transistor (T) may be provided with two neighboring diffusion regions (D or diff). For instance, a first transistor may be provided with D2-1/gate/D2-2 and a second transistor may be provided with D1-1/gate/D1-2, wherein the gates share WL12-1, and wherein different bitlines (BL) and/or different ground lines (GL) are coupled to D1-1, D2-1, D1-2, D2-2. Also, a third transistor may be provided with D2-2/gate/D2-3 and a fourth transistor may be provided with D1-2/gate/D1-3, wherein the gates share WL12-2, and wherein different bitlines (BL) and/or different ground lines (GL) are coupled to D1-2, D2-2, D1-3, D2-3. Also, each different bitline (BL) and/or ground line (GL) may be separated by an insulator (ins).

In various implementations, the transistors in the multi-stack of transistors 214A may be formed in the memory architecture as a three-dimensional (3D) memory structure, wherein the multi-bitcell stack configuration has at least two transistors in the multi-stack of transistors 214A. Also, in some applications, each transistor may be configured to store a logical value of zero (0) when coupled between ground (VSS) and a bitline (BL) by way of its corresponding bitline of each different bitline. For instance, as described in reference to FIGS. 1A-1C, a logic zero (0) may be encoded by coupling one source/drain to ground (VSS) and another source/drain to a bitline (BL), and a logic one (1) may be encoded by coupling source/drain regions to ground (VSS), and also, a logic one (1) may be encoded by coupling source/drain regions to the same bitline (BL). In some applications, as will be shown in FIGS. 6A-6B herein, a global wordline (GWL) may be coupled to the wordline (WL) such that the global wordline (GWL) is shared across the transistors.

As shown in FIG. 2B, the multi-stack bitcell architecture 204B may include a memory architecture with a multi-stack of transistors 214B arranged in a multi-bitcell stack configuration, and a bitline (BL) may be shared across the transistors of the multi-stack of transistors with each transistor coupled to a different wordline (WL). In various instances, the bitline (BL) may be shared across the transistors by way of the diffusion regions (D or diff) associated with the bitcell. Moreover, in various applications, each individual source/drain belonging to each transistor in a stack may be independently coupled or connected to ground (VSS) or to a bitline (BL).

As described in reference to FIGS. 1A-1C, the diffusion regions (D or diff) may be coupled to a bitline (BL) or ground (VSS), and the gate regions (gate) may be coupled to a wordline (WL). Also, a transistor (T) may be provided with two neighboring diffusion regions (D or diff). For instance, a first transistor may be provided with D2-1/gate/D2-2 and a second transistor may be provided with D1-1/gate/D1-2, wherein gates are coupled to different wordlines WL2-1 and WL1-1, and wherein diffusion regions D2-1 and D1-1 share a bitline (BL) and/or a ground line (GL), and wherein diffusion regions D2-2 and D1-2 share another bitline (BL) and/or another ground line (GL). Also, a third transistor may be provided with D2-2/gate/D2-3 and a fourth transistor may be provided with D1-2/gate/D1-3, wherein gates are coupled to different wordlines WL2-2 and WL1-2, and wherein diffusion regions D2-2 and D1-2 share a bitline (BL) and/or a ground line (GL), and wherein diffusion regions D2-3 and D1-3 share another bitline (BL) and/or another ground line (GL). In addition, in some applications, each different wordline (WL) may be separated or isolated by an insulator (ins).

In various applications, as shown in reference to FIG. 2B and various other Figures described herein, the lidc refers to a local interconnect drain connection, and the cdc refers to a conditional drain connection, such as local interconnect-based connection if the diffusion is programmed as bitline. Also, the black insulator (ins) may refer to various isolation materials that provide isolation and/or separation between components.

In various implementations, the transistors in the multi-stack of transistors 214B may be formed in the memory architecture as a three-dimensional (3D) memory structure, wherein the multi-bitcell stack configuration has at least two transistors in the multi-stack of transistors 214B. Also, in some applications, each transistor may be configured to store a logical value of zero (0) when coupled between ground (VSS) and a bitline (BL) by way of its corresponding bitline of each different bitline. For instance, as described in reference to FIGS. 1A-1C, a logic zero (0) may be encoded by coupling one source/drain to ground (VSS) and another source/drain to a bitline (BL), and a logic one (1) may be encoded by coupling source/drain regions to ground (VSS), and also, a logic one (1) may be encoded by coupling source/drain regions to the same bitline (BL). In some applications, as will be shown in FIGS. 6A-6B herein, a global wordline (GWL) may be coupled to the wordline (WL) such that the global wordline (GWL) is shared across the transistors.

As shown in FIG. 2C, the multi-stack bitcell architecture 204C may include a memory architecture with a multi-stack of transistors 214C arranged in a multi-bitcell stack configuration, and a wordline (WL) may be shared across the transistors of the multi-stack of transistors with each transistor coupled to a different bitline (BL) by way of the diffusion regions (D or diff) associated with the bitcell. Also, in some instances, the wordline (WL) may be shared across the transistors by way of the gate regions (gate). Also, in various applications, each individual source/drain belonging to each transistor in a stack may be independently coupled or connected to ground (VSS) or to a bitline (BL).

As described in reference to FIGS. 1A-1C, the diffusion regions (D or diff) may be coupled to a bitline (BL) or ground (VSS), and the gate regions (gate) may be coupled to a wordline (WL). Also, a transistor (T) may be provided with two neighboring diffusion regions (D or diff). For instance, a first transistor may be provided with D4-1/gate/D4-2, a second transistor may be provided with D3-1/gate/D3-2, a third transistor may be provided with D2-1/gate/D2-2, a fourth transistor may be provided with D1-1/gate/D1-2, wherein the gates share WL1234-1, and wherein different bitlines (BL) and/or different ground lines (GL) are coupled to D1-1, D2-1, D3-1, D4-1, D1-2, D2-2, D3-2, D4-2. Also, a fifth transistor may be provided with D4-2/gate/D4-3 and a sixth transistor may be provided with D3-2/gate/D3-3, a seventh transistor may be provided with D2-2/gate/D2-3 and an eighth transistor may be provided with D1-2/gate/D1-3, wherein the gates share WL1234-2, and wherein different bitlines (BL) and/or different ground lines (GL) are coupled to D1-2, D2-2, D3-2, D4-2, D1-3, D2-3, D3-3, D4-3. In addition, each different bitline (BL) and/or ground line (GL) may be separated by an insulator (ins).

In various implementations, the transistors in the multi-stack of transistors 214C may be formed in the memory architecture as a three-dimensional (3D) memory structure, wherein the multi-bitcell stack configuration has at least four transistors in the multi-stack of transistors 214C. In some applications, each transistor may be configured to store a logical value of zero (0) when coupled between ground (VSS) and a bitline (BL) by way of its corresponding bitline of each different bitline. For instance, as described in reference to FIGS. 1A-1C, a logic zero (0) may be encoded by coupling one source/drain to ground (VSS) and another source/drain to a bitline (BL), and a logic one (1) may be encoded by coupling source/drain regions to ground (VSS), and also, a logic one (1) may be encoded by coupling source/drain regions to the same bitline (BL). In some applications, as will be shown in FIGS. 6A-6B herein, a global wordline (GWL) may be coupled to the wordline (WL) such that the global wordline (GWL) is shared across the transistors.

As shown in FIG. 2D, the multi-stack bitcell architecture 204D may include a memory architecture with a multi-stack of transistors 214D arranged in a multi-bitcell stack configuration, and a bitline (BL) may be shared across the transistors of the multi-stack of transistors with each transistor coupled to a different wordline (WL). In various instances, the bitline (BL) may be shared across the transistors by way of the diffusion regions (D or diff) associated with the bitcell. Moreover, in various applications, each individual source/drain belonging to each transistor in a stack may be independently coupled or connected to ground (VSS) or to a bitline (BL).

As described in reference to FIGS. 1A-1C, the diffusion regions (D or diff) may be coupled to a bitline (BL) or ground (VSS), and the gate regions (gate) may be coupled to a wordline (WL). Also, a transistor (T) may be provided with two neighboring diffusion regions (D or diff). For instance, a first transistor may be provided with D4-1/gate/D4-2, a second transistor may be provided with D3-1/gate/D3-2, a third transistor may be provided with D2-1/gate/D2-2 and a fourth transistor may be provided with D1-1/gate/D1-2, wherein gates are coupled to different wordlines WL4-1, WL3-1, WL2-1 and WL1-1, and wherein diffusion regions D4-1, D3-1, D2-1 and D1-1 share a bitline (BL) and/or a ground line (GL), and wherein the diffusion regions D4,-2, D3-2, D2-2 and D1-2 share another bitline (BL) and/or another ground line (GL). Also, a fifth transistor may be provided with D4-2/gate/D4-3, a sixth transistor may be provided with D3-2/gate/D3-3, a seventh transistor may be provided with D2-2/gate/D2-3 and an eighth transistor may be provided with D1-2/gate/D1-3, wherein gates are coupled to different wordlines WL4-2, WL3-2, WL2-2 and WL1-2, and wherein diffusion regions D4-2, D3-2, D2-2 and D1-2 share a bitline (BL) and/or a ground line (GL), and wherein diffusion regions D4-3, D3-3, D2-3 and D1-3 share another bitline (BL) and/or another ground line (GL). In addition, in some applications, each different wordline (WL) may be separated or isolated by an insulator (ins).

In various implementations, the transistors in the multi-stack of transistors 214D may be formed in the memory architecture as a three-dimensional (3D) memory structure, wherein the multi-bitcell stack configuration has at least four transistors in the multi-stack of transistors 214D. In some applications, each transistor may be configured to store a logical value of zero (0) when coupled between ground (VSS) and a bitline (BL) by way of its corresponding bitline of each different bitline. For instance, as described in reference to FIGS. 1A-1C, a logic zero (0) may be encoded by coupling one source/drain to ground (VSS) and another source/drain to a bitline (BL), and a logic one (1) may be encoded by coupling source/drain regions to ground (VSS), and also, a logic one (1) may be encoded by coupling source/drain regions to the same bitline (BL). In some applications, as will be shown in FIGS. 6A-6B herein, a global wordline (GWL) may be coupled to the wordline (WL) such that the global wordline (GWL) is shared across the transistors.

As shown in FIG. 2E, the multi-stack bitcell architecture 204E may include a memory architecture with a multi-stack of transistors 214E arranged in a multi-bitcell stack configuration, and a bitline (BL) may be shared across the transistors of the multi-stack of transistors with each transistor coupled to a different wordline (WL). In various instances, the bitline (BL) may be shared across the transistors by way of the diffusion regions (D or diff) associated with the bitcell. Also, in some instances, the wordline (WL) may be shared across the transistors by way of the gate regions (gate). Moreover, in various applications, each individual source/drain belonging to each transistor in a stack may be independently coupled or connected to ground (VSS) or to a bitline (BL).

In some implementations, the multi-stack bitcell architecture 204E in FIG. 2E refers to a first type of hybrid configuration to that of multi-stack bitcell architecture 204D shown in FIG. 2D. For instance, a first transistor may be provided with D4-1/gate/D4-2, a second transistor may be provided with D3-1/gate/D3-2, a third transistor may be provided with D2-1/gate/D2-2 and a fourth transistor may be provided with D1-1/gate/D1-2, wherein gates are coupled to different wordlines WL34-1 and WL12-1, and wherein diffusion regions D4-1, D2-1 share a bitline (BL) and/or a ground line (GL), and wherein diffusion regions D3-1, D1-1 share another bitline (BL) and/or another ground line (GL), and wherein diffusion regions D4-2, D2-2 share another bitline (BL) and/or another ground line (GL), and wherein diffusion regions D3-2, D1-2 share another bitline (BL) and/or another ground line (GL). Also, a fifth transistor may be provided with D4-2/gate/D4-3, a sixth transistor may be provided with D3-2/gate/D3-3, a seventh transistor may be provided with D2-2/gate/D2-3 and an eighth transistor may be provided with D1-2/gate/D1-3, wherein gates are coupled to different wordlines WL34-2 and WL1-2, and wherein diffusion regions D4-2 and D2-2 share a bitline (BL) and/or a ground line (GL), and wherein diffusion regions D3-2 and D1-2 share another bitline (BL) and/or another ground line (GL), and wherein diffusion regions D4-3 and D2-3 share another bitline (BL) and/or another ground line (GL), and wherein diffusion regions D3-3 and D1-3 share another bitline (BL) and/or another ground line (GL). Also, in various applications, each different wordline (WL) may be separated or isolated by an insulator (ins).

In various implementations, the transistors in the multi-stack of transistors 214E may be formed in the memory architecture as a three-dimensional (3D) memory structure, wherein the multi-bitcell stack configuration has at least four transistors in the multi-stack of transistors 214E. In some applications, each transistor may be configured to store a logical value of zero (0) when coupled between ground (VSS) and a bitline (BL) by way of its corresponding bitline of each different bitline. For instance, as described in reference to FIGS. 1A-1C, a logic zero (0) may be encoded by coupling one source/drain to ground (VSS) and another source/drain to a bitline (BL), and a logic one (1) may be encoded by coupling source/drain regions to ground (VSS), and also, a logic one (1) may be encoded by coupling source/drain regions to the same bitline (BL). In some applications, as will be shown in FIGS. 6A-6B herein, a global wordline (GWL) may be coupled to the wordline (WL) such that the global wordline (GWL) is shared across the transistors.

As shown in FIG. 2F, the multi-stack bitcell architecture 204F may include a memory architecture with a multi-stack of transistors 214F arranged in a multi-bitcell stack configuration, and a bitline (BL) may be shared across the transistors of the multi-stack of transistors with each transistor coupled to a different wordline (WL). In various instances, the bitline (BL) may be shared across the transistors by way of the diffusion regions (D or diff) associated with the bitcell. Also, in some instances, the wordline (WL) may be shared across the transistors by way of the gate regions (gate). Moreover, in various applications, each individual source/drain belonging to each transistor in a stack may be independently coupled or connected to ground (VSS) or to a bitline (BL).

In some implementations, the multi-stack bitcell architecture 204F in FIG. 2F refers to a second type of hybrid configuration to that of the multi-stack bitcell architecture 204D shown in FIG. 2D. As such, a first transistor may be provided with D4-1/gate/D4-2, a second transistor may be provided with D3-1/gate/D3-2, a third transistor may be provided with D2-1/gate/D2-2 and a fourth transistor may be provided with D1-1/gate/D1-2, wherein gates are coupled to different wordlines WL34-1 and WL12-1, and wherein diffusion regions D4-1, D1-1 share a bitline (BL) and/or a ground line (GL), and wherein diffusion regions D3-1, D2-1 share another bitline (BL) and/or another ground line (GL), and wherein diffusion regions D4-2, D1-2 share another bitline (BL) and/or another ground line (GL), and wherein diffusion regions D3-2, D2-2 share another bitline (BL) and/or another ground line (GL). Also, a fifth transistor may be provided with D4-2/gate/D4-3, a sixth transistor may be provided with D3-2/gate/D3-3, a seventh transistor may be provided with D2-2/gate/D2-3 and an eighth transistor may be provided with D1-2/gate/D1-3, wherein gates are coupled to different wordlines WL34-2 and WL1-2, and wherein diffusion regions D4-2 and D1-2 share a bitline (BL) and/or a ground line (GL), and wherein diffusion regions D3-2 and D2-2 share another bitline (BL) and/or another ground line (GL), and wherein diffusion regions D4-3 and D1-3 share another bitline (BL) and/or another ground line (GL), and wherein diffusion regions D3-3 and D2-3 share another bitline (BL) and/or another ground line (GL). Also, in various applications, each different wordline (WL) may be separated or isolated by an insulator (ins).

In various implementations, the transistors in the multi-stack of transistors 214E may be formed in the memory architecture as a three-dimensional (3D) memory structure, wherein the multi-bitcell stack configuration has at least four transistors in the multi-stack of transistors 214E. In some applications, each transistor may be configured to store a logical value of zero (0) when coupled between ground (VSS) and a bitline (BL) by way of its corresponding bitline of each different bitline. For instance, as described in reference to FIGS. 1A-1C, a logic zero (0) may be encoded by coupling one source/drain to ground (VSS) and another source/drain to a bitline (BL), and a logic one (1) may be encoded by coupling source/drain regions to ground (VSS), and also, a logic one (1) may be encoded by coupling source/drain regions to the same bitline (BL). In some applications, as will be shown in FIGS. 6A-6B herein, a global wordline (GWL) may be coupled to the wordline (WL) such that the global wordline (GWL) is shared across the transistors.

In various implementations, each of the multi-stack bitcell architectures 204E, 204F in FIGS. 2E-2F may refer to a memory architecture with a multi-stack of transistors that are arranged in a multi-bitcell stack configuration 214E. In some applications, a first wordline may be shared across a first set of transistors of the multi-stack of transistors, wherein each transistor in the first set of transistors may be coupled to a first set of shared bitlines. Further, in some applications, a second wordline may be shared across a second set of transistors of the multi-stack of transistors, wherein each transistor in the second set of transistors may be coupled to a second set of shared bitlines.

Also, in various implementations, in reference to FIGS. 2A-2F, the transistors in the multi-stack of transistors may refer to N-type transistors. However, in various other configurations, P-type transistors or various combinations of N-type and P-type transistors may be used to achieve similar results, behaviors and/or characteristics.

FIGS. 3A-3H illustrate various diagrams of multi-transistor stack architecture in multi-device stack configurations, such as, e.g., 2T stack configurations, in accordance with various implementations described herein. In particular, FIGS. 3A, 3C, 3E and 3G show various diagrams of a multi-transistor stack with a single common-gate architecture, and in addition, FIGS. 3B, 3D, 3F and 3H show various diagrams of the multi-transistor stack with a split-gate architecture.

Figure 3A:
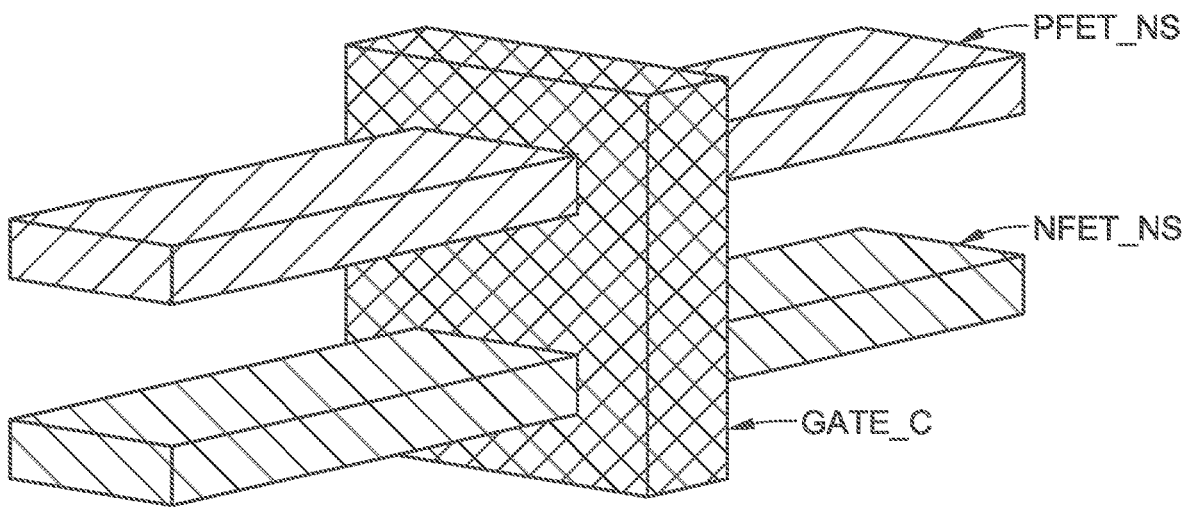
FIGS. 3A-3H illustrate various diagrams of multi-transistor stack architecture in multi-device stack configurations, such as, e.g., two-transistor (2T) stack configurations in accordance with various implementations described herein.

As shown in FIG. 3A, the P-over-N common-gate multi-transistor architecture 304A may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, in some instances, the common-gate architecture 304A may refer to a single gate (e.g., single poly gate) coupled to the multiple transistors, such as, e.g., the single common-gate (GATE_C) coupled to the PFET_NS device and the NFET_NS device. This arrangement may provide the P-over-N (PN) stack configuration as a two-FET stacked device that is manufactured and/or formed in a single monolithic semiconductor die or in a sequential manner. Also, in various instances, the complementary P-type and N-type transistors refer to P-type and N-type field-effect transistors (PFET and NFET) that are disposed as a pair of transistors arranged in the P-over-N stack configuration. Also, the P-over-N multi-transistor architecture 304A with the common-gate (GATE_C) may be used to implement an inverter.

Figure 3B:
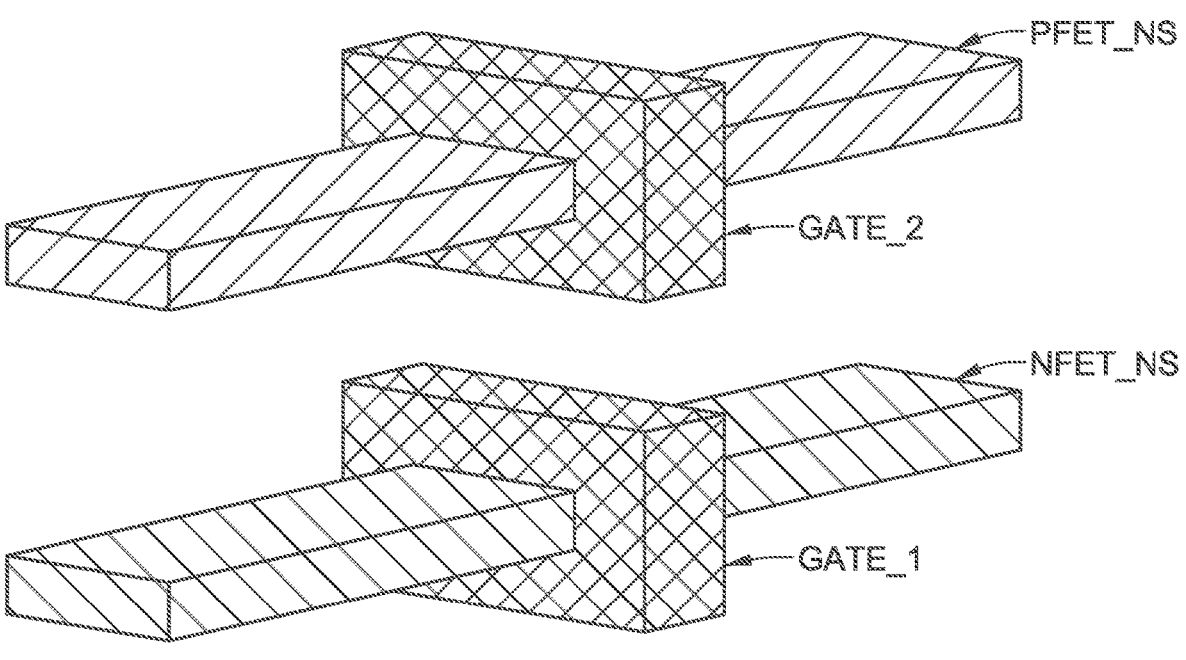

As shown in FIG. 3B, the P-over-N split-gate multi-transistor architecture 304B may include multiple transistors (e.g., 1-PFET device over 1-NFET device) arranged in a multi-transistor stack configuration, such as, e.g., an NFET device formed in a first nano-sheet (NFET_NS) and a PFET device formed in a second nano-sheet (PFET_NS) that is disposed above the NFET_NS device. Also, the split-gate architecture 304B may refer to multiple gates (e.g., dual poly gates) coupled to the multiple transistors, such as, e.g., a first gate (GATE_1) of the split-gate coupled to the NFET_NS device and a second gate (GATE_2) of the split-gate coupled to the PFET_NS device. Also, this arrangement may provide the P-over-N (PN) stack configuration as a two-FET stacked device that is manufactured and/or formed in a single monolithic semiconductor die or in a sequential manner. Moreover, in some instances, the complementary P-type and N-type transistors refer to PFET/NFET devices that are disposed as a pair of transistors arranged in the P-over-N stack configuration.

Figure 3C:
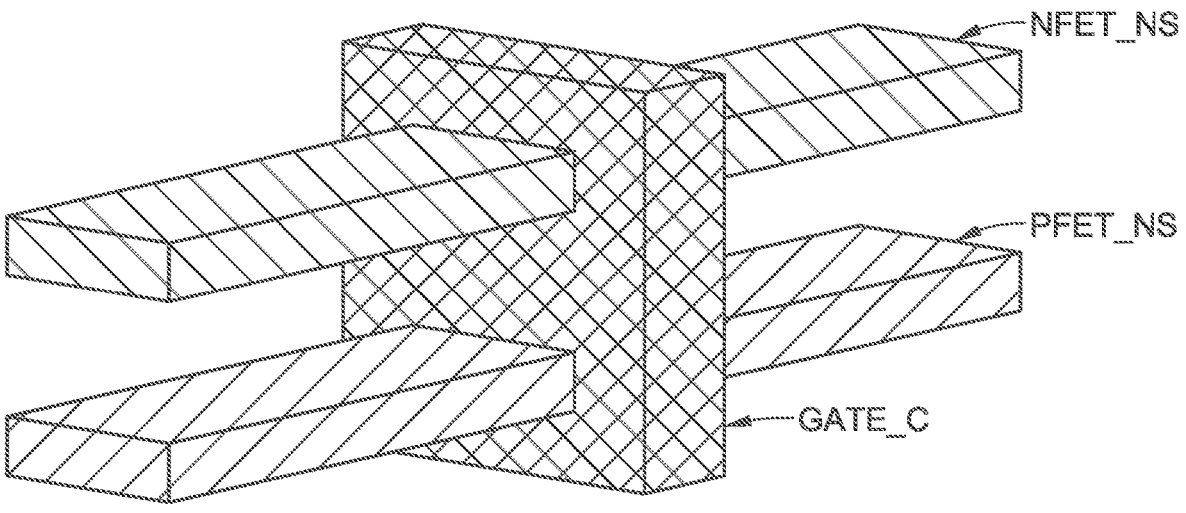

As shown in FIG. 3C, the N-over-P common-gate multi-transistor architecture 304C may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, in some instances, the common-gate architecture 304C may refer to a single gate (e.g., single poly gate) coupled to the multiple transistors, such as, e.g., the single common-gate (GATE_C) coupled to the NFET_NS device and the PFET_NS device. This arrangement provides the N-over-P (NP) stack configuration as a two-FET stacked device that is manufactured and/or formed in a single monolithic semiconductor die or in a sequential manner. Further, in some instances, the complementary N-type and P-type transistors refer to NFET and PFET devices disposed as a pair of transistors that are arranged in the N-over-P stack configuration. Also, in some instances, the N-over-P multi-transistor architecture 304C with the common-gate (GATE_C) may be used to implement an inverter.

Figure 3D:
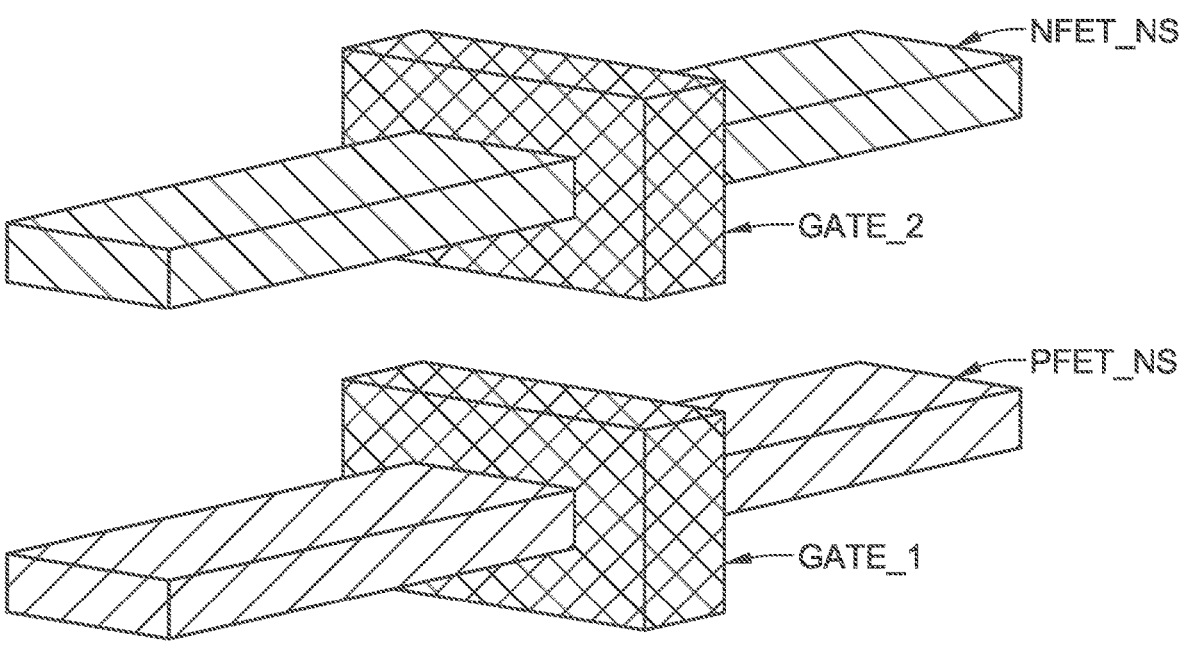

As shown in FIG. 3D, the N-over-P split-gate multi-transistor architecture 304D may include multiple transistors (e.g., 1-NFET device over 1-PFET device) arranged in a multi-transistor stack configuration, such as, e.g., a PFET device formed in a first nano-sheet (PFET_NS) and an NFET device formed in a second nano-sheet (NFET_NS) that is disposed above the PFET_NS device. Also, the split-gate architecture 304D may refer to multiple gates (e.g., dual poly gates) coupled to the multiple transistors, such as, e.g., a first gate (GATE_1) of the split-gate coupled to the PFET_NS device and a second gate (GATE_2) of the split-gate coupled to the NFET_NS device. Also, this arrangement may provide the N-over-P (NP) stack configuration as a two-FET stacked device that is manufactured and/or formed in a single monolithic semiconductor die or in a sequential manner. Moreover, in some instances, the complementary N-type and P-type transistors refer to NFET/PFET devices that are disposed as a pair of transistors arranged in the N-over-P stack configuration.

Figure 3E:
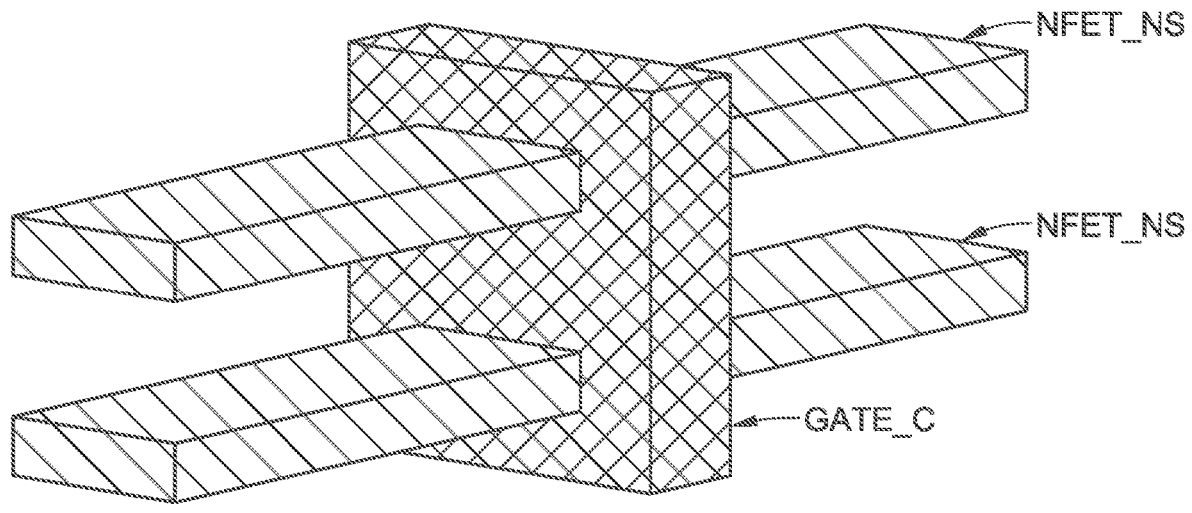

As shown in FIG. 3E, the N-over-N common-gate multi-transistor architecture 304E may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the common-gate architecture 304E refers to a single gate (e.g., single poly gate) coupled to the multiple transistors, such as, e.g., the single common-gate (GATE_C) coupled to the NFET_NS_1 device and the NFET_NS_2 device. This arrangement provides the N-over-N(NN) stack configuration as a two-FET stacked device that is manufactured and/or formed in a single monolithic semiconductor die or in a sequential manner. Moreover, in some instances, the dual N-over-N transistors refer to an NFET-over-NFET device disposed as a pair of transistors that are arranged in the N-over-N(NN) stack configuration.

In some implementations, the N-over-N multi-device stack 304E may refer to a device having a multi-transistor logic structure for use in memory architecture, wherein the multi-transistor logic structure has multiple transistors that are arranged in a single multi-transistor stack used to increase strength of the device. For instance, as shown in FIG. 3E, the N-over-N multi-device stack 304E includes two N-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the N-over-N multi-device stack 304E. In other instances, three transistors in a single stack with a common-gate may be used to increase strength of a device by a factor of three (e.g., triple strength). Also, in other instances, four transistors in a single stack with a common-gate may be used to increase strength of a device by a factor of four (e.g., quadruple strength).

Figure 3F:
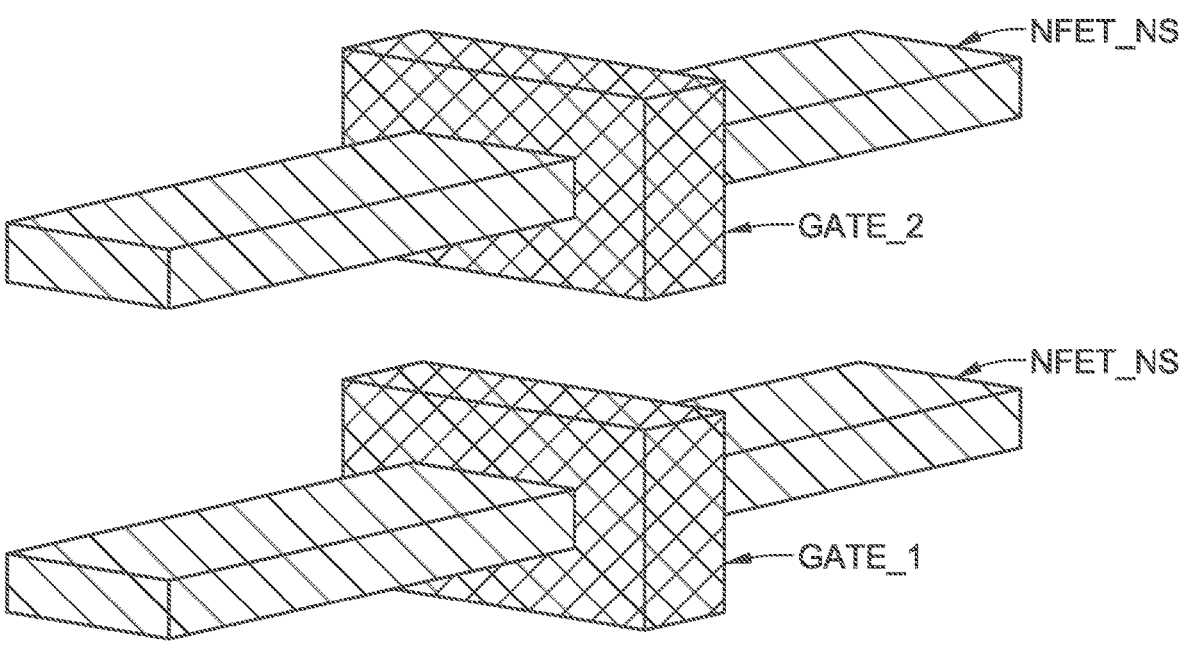

As shown in FIG. 3F, the N-over-N split-gate multi-transistor architecture 304F may include multiple transistors (e.g., 1-NFET device over 1-NFET device) arranged in a multi-transistor stack configuration, such as, e.g., a first NFET device formed in a first nano-sheet (NFET_NS_1) and a second NFET device formed in a second nano-sheet (NFET_NS_2) that is disposed above the NFET_NS_1 device. Also, in some instances, the split-gate architecture 304F may refer to multiple gates (e.g., dual poly gates) coupled to the multiple transistors, such as, e.g., a first gate (GATE_1) of the split-gate coupled to the NFET_NS_1 device and also a second gate (GATE_2) of the split-gate coupled to the NFET_NS_2 device. Also, as shown, this arrangement may provide the N-over-N(NN) stack configuration as a two-FET stacked device that is manufactured and/or formed in a single monolithic semiconductor die or in a sequential manner. Moreover, in some instances, the dual N-over-N transistors refer to an NFET-over-NFET device disposed as a pair of transistors that are arranged in the N-over-N(NN) stack configuration.

Figure 3G:
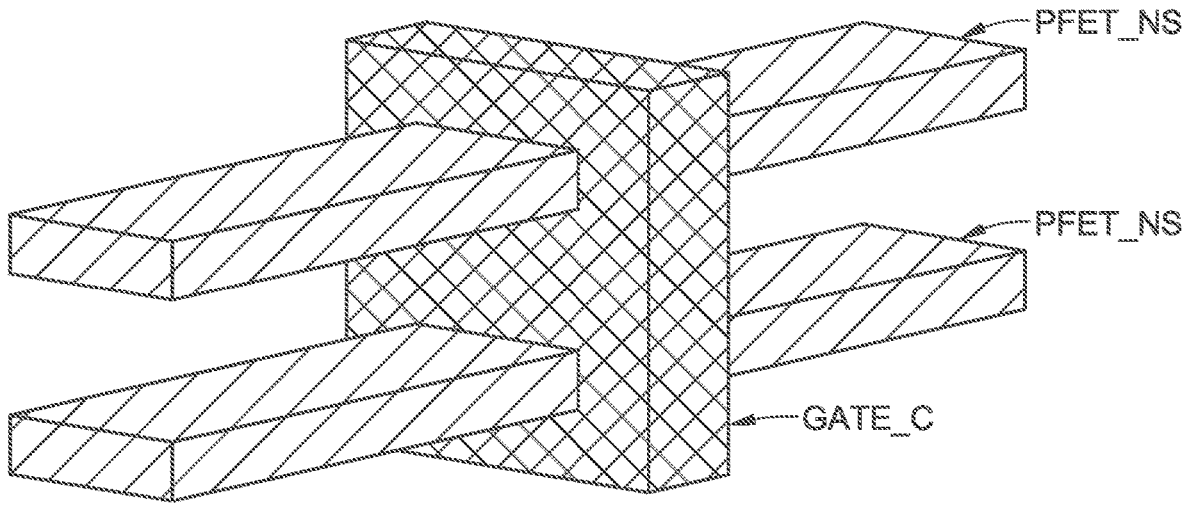

As shown in FIG. 3G, the P-over-P common-gate multi-transistor architecture 304E may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the common-gate architecture 304G refers to a single gate (e.g., single poly gate) coupled to the multiple transistors, such as, e.g., the single common-gate (GATE_C) coupled to the PFET_NS_1 device and the PFET_NS_2 device. This arrangement provides the P-over-P (PP) stack configuration as a two-FET stacked device that is manufactured and/or formed in a single monolithic semiconductor die or in a sequential manner. Moreover, in some instances, the dual P-over-P transistors refer to a PFET-over-PFET device disposed as a pair of transistors that are arranged in the P-over-P (PP) stack configuration.

In some implementations, the P-over-P multi-device stack 304G may refer to a device having a multi-transistor logic structure for use in memory architecture, wherein the multi-transistor logic structure has multiple transistors that are arranged in a single multi-transistor stack used to increase strength of the device. For instance, as shown in FIG. 3G, the P-over-P multi-device stack 304G includes two P-type transistors arranged in a single multi-transistor stack with a common-gate (GATE_C) that is used to increase strength of the device by a factor of two (e.g., double strength). In some instances, the common-gate (or single-gate) may be used to activate both transistors at the same time, which effectively doubles the strength of the P-over-P multi-device stack 304G. In other instances, three transistors in a single stack with a common-gate may be used to increase strength of a device by a factor of three (e.g., triple strength). Further, in other instances, four transistors in a single stack with a common-gate may be used to increase strength of a device by a factor of four (e.g., quadruple strength).

Figure 3H:
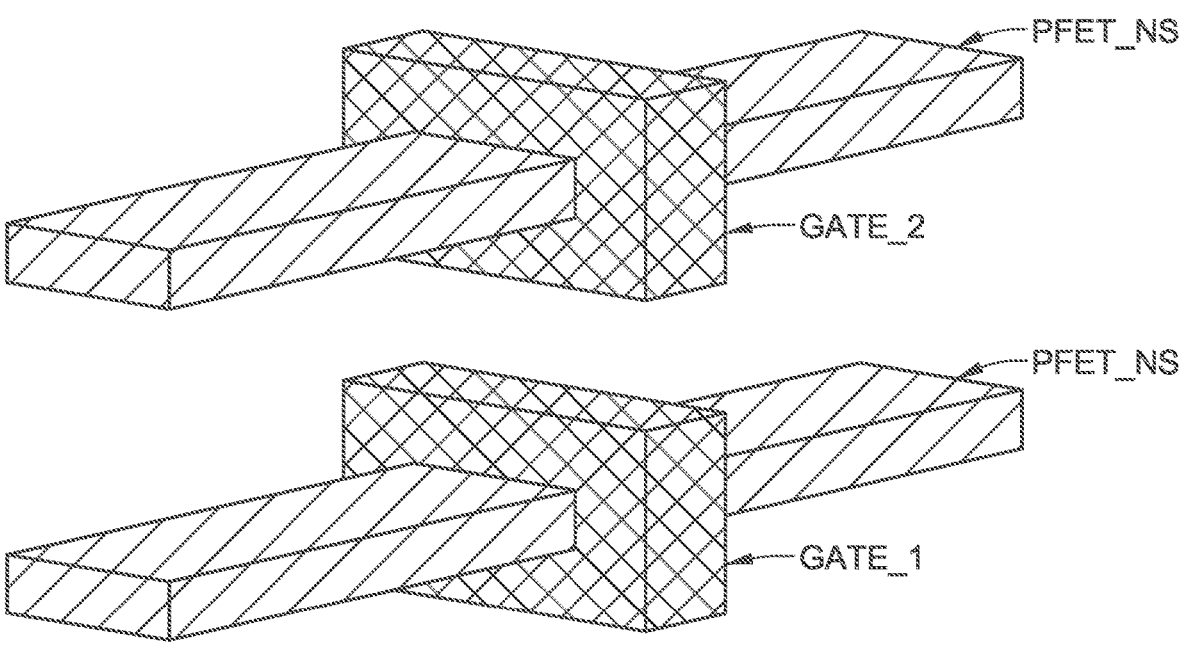

As shown in FIG. 3H, the P-over-P split-gate multi-transistor architecture 304H may include multiple transistors (e.g., 1-PFET device over 1-PFET device) arranged in a multi-transistor stack configuration, such as, e.g., a first PFET device formed in a first nano-sheet (PFET_NS_1) and a second PFET device formed in a second nano-sheet (PFET_NS_2) that is disposed above the PFET_NS_1 device. Also, in some instances, the split-gate architecture 304H may refer to multiple gates (e.g., dual poly gates) coupled to the multiple transistors, such as, e.g., a first gate (GATE_1) of the split-gate coupled to the PFET_NS_1 device and also a second gate (GATE_2) of the split-gate coupled to the PFET_NS_2 device. Also, as shown, this arrangement may provide the P-over-P (PP) stack configuration as a two-FET stacked device that is manufactured and/or formed in a single monolithic semiconductor die or in a sequential manner. Moreover, in some instances, the dual P-over-P transistors refer to a PFET-over-PFET device disposed as a pair of transistors that are arranged in the P-over-P (PP) stack configuration.

In some implementations, in reference to FIGS. 3A-3H, the gate architectures may utilize a common-gate architecture and/or a split-gate architecture. For instance, as shown in FIGS. 3A, 3C, 3E and 3G, the multiple transistors (PFET and NFET) may share a single gate structure. Thus, the pair of stacked PFET/NFET devices may share a single common-gate structure. In other instances, as shown in FIGS. 3B, 3D, 3F and 3H, the multiple transistors (PFET and NFET) may utilize a split-gate structure. Thus, the pair of stacked PFET/NFET devices may share a dual split-gate structure.

Figure 4A:
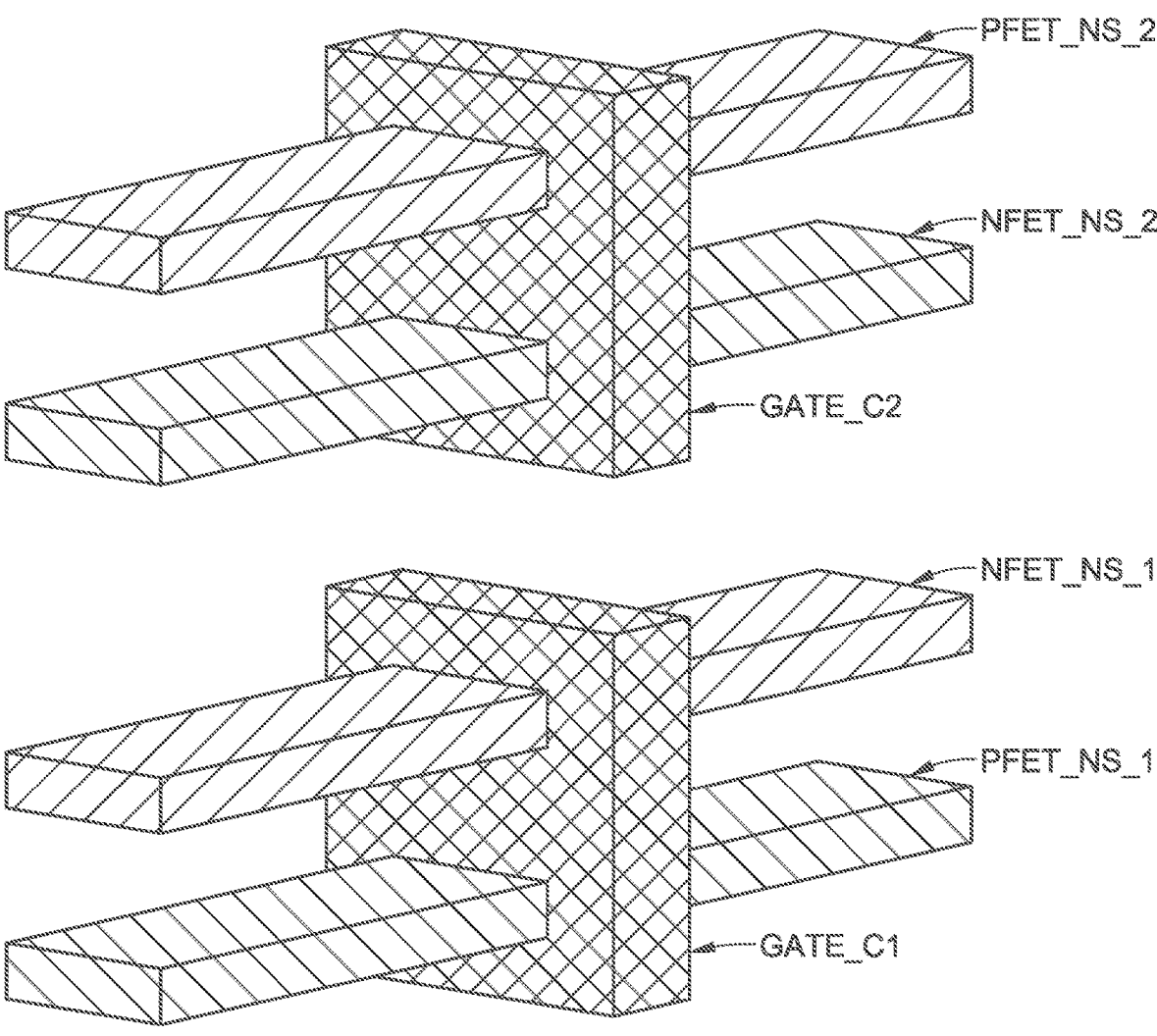
FIGS. 4A-4P illustrate various diagrams of multi-transistor stack architecture in multi-device stack configurations, such as, e.g., four-transistor (4T) stack configurations in accordance with various implementations described herein.
Figure 4B:
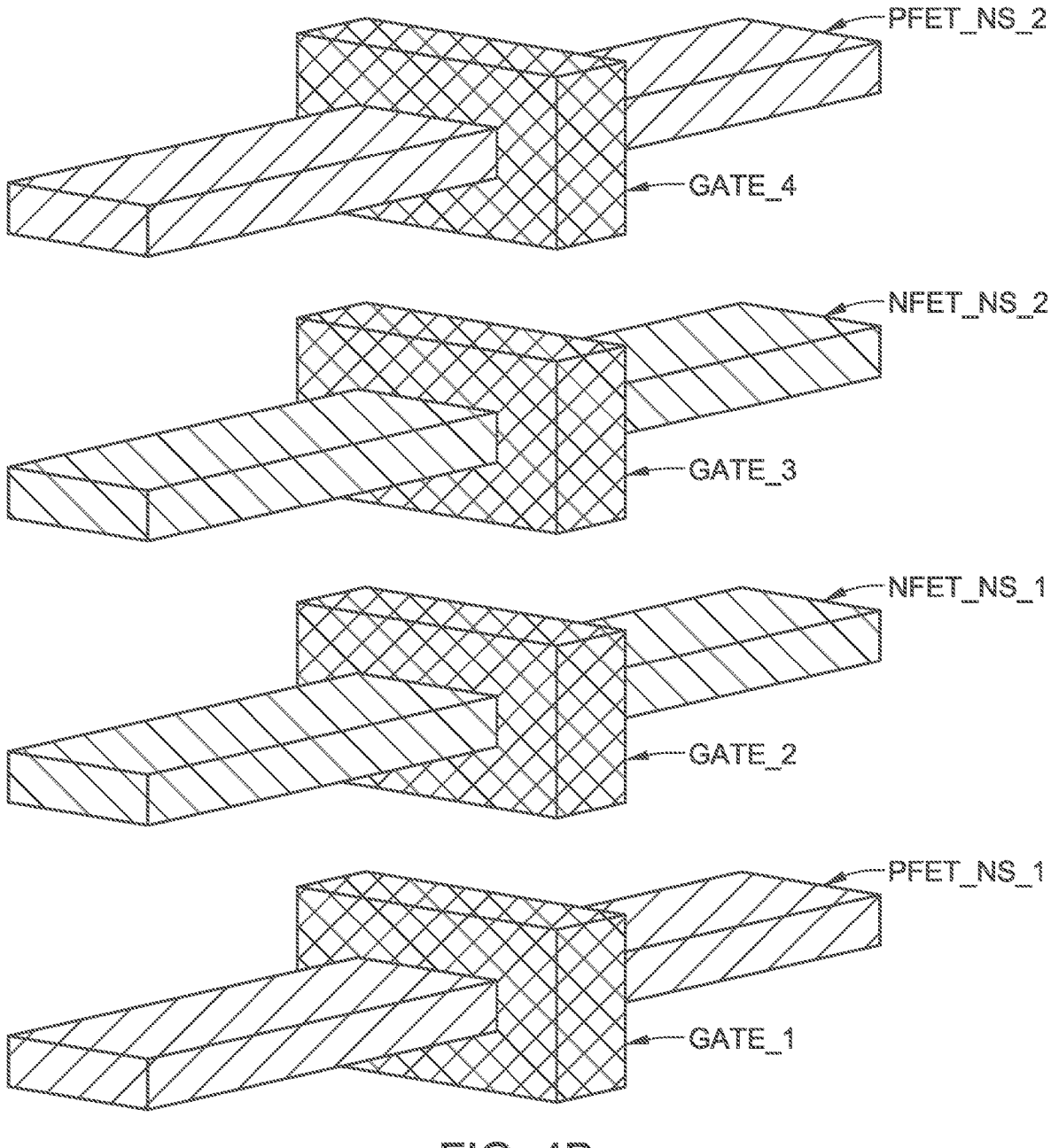
Figure 4C:
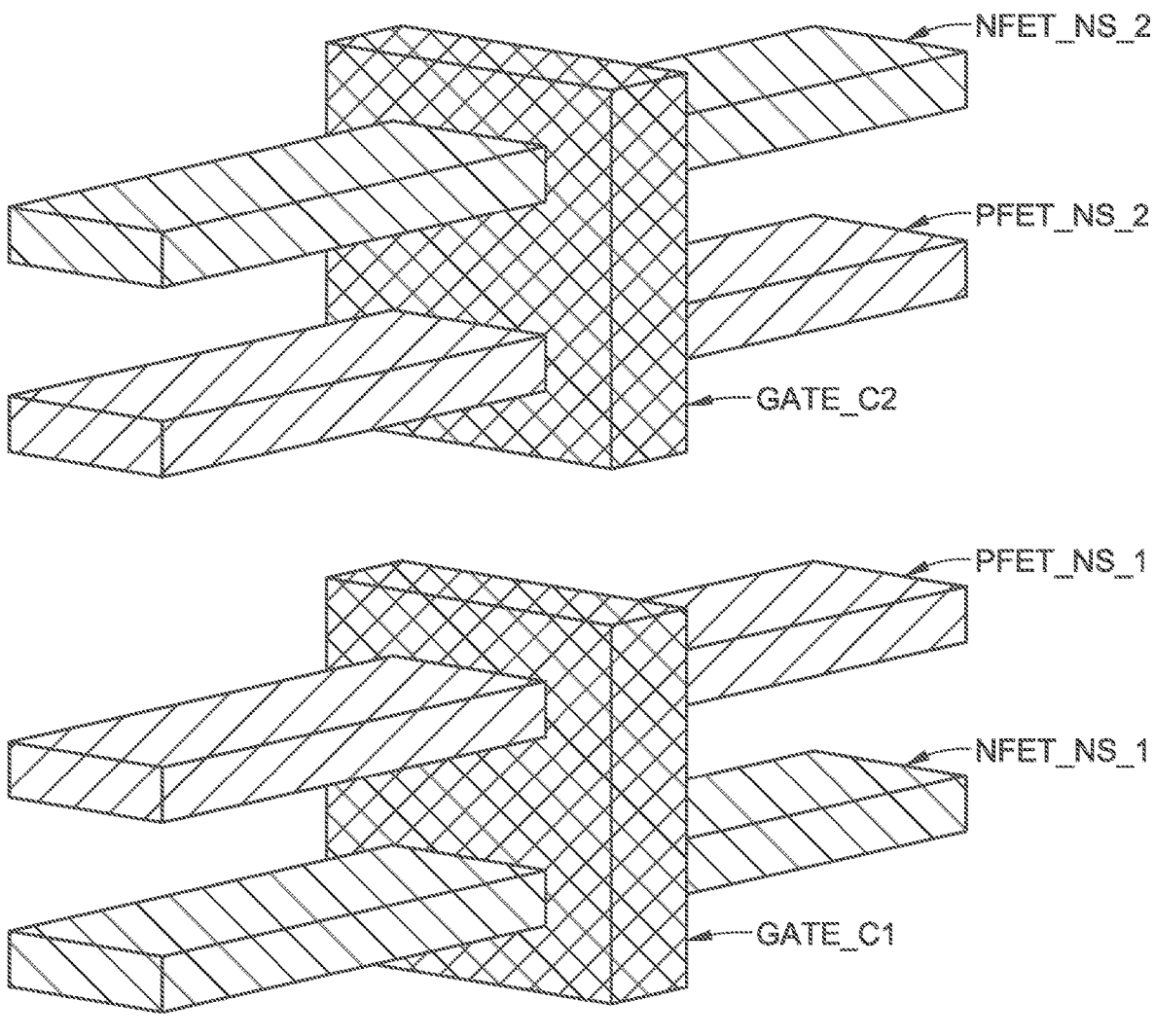
Figure 4D:
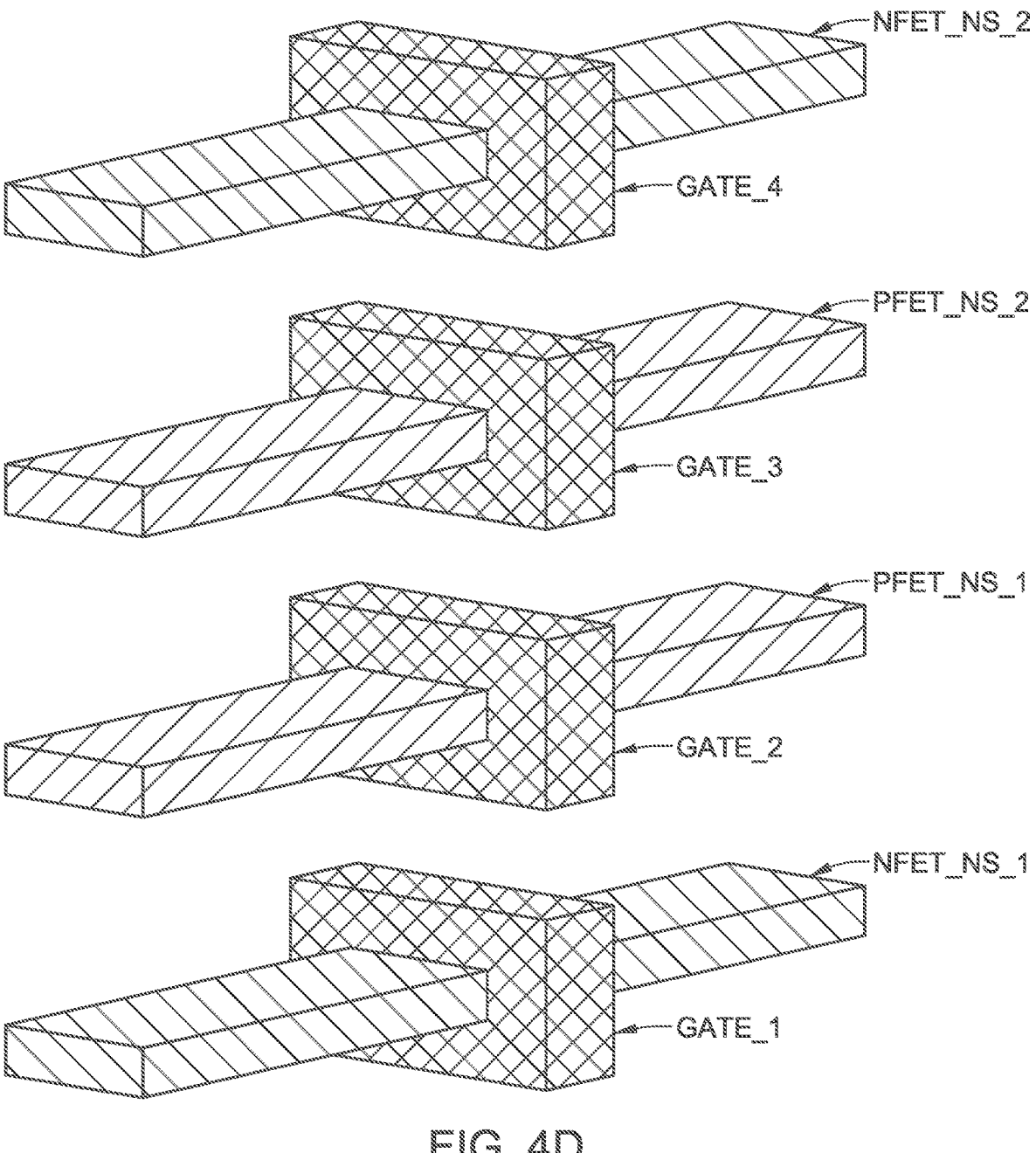
Figure 4E:
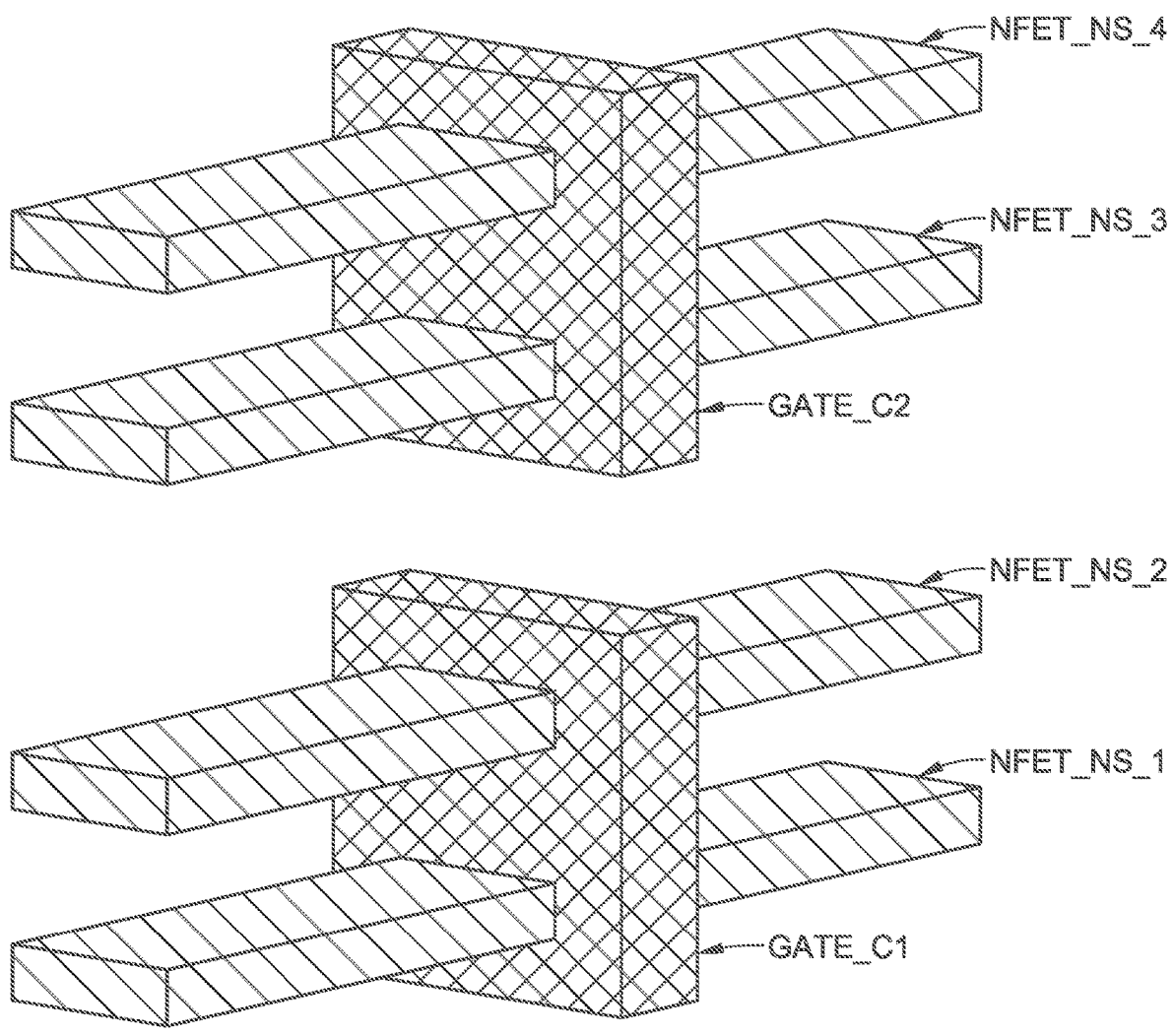
Figure 4F:
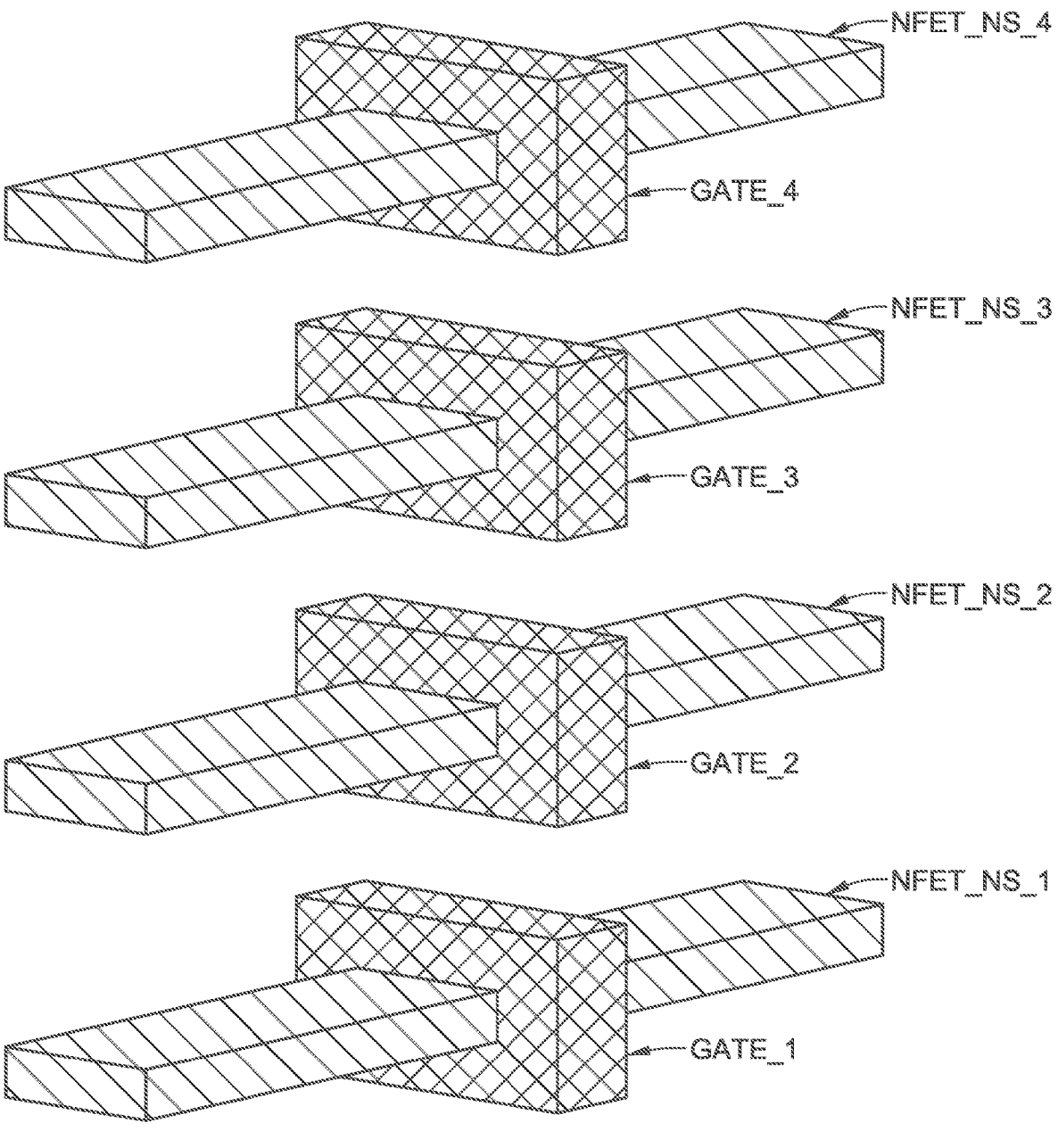
Figure 4G:
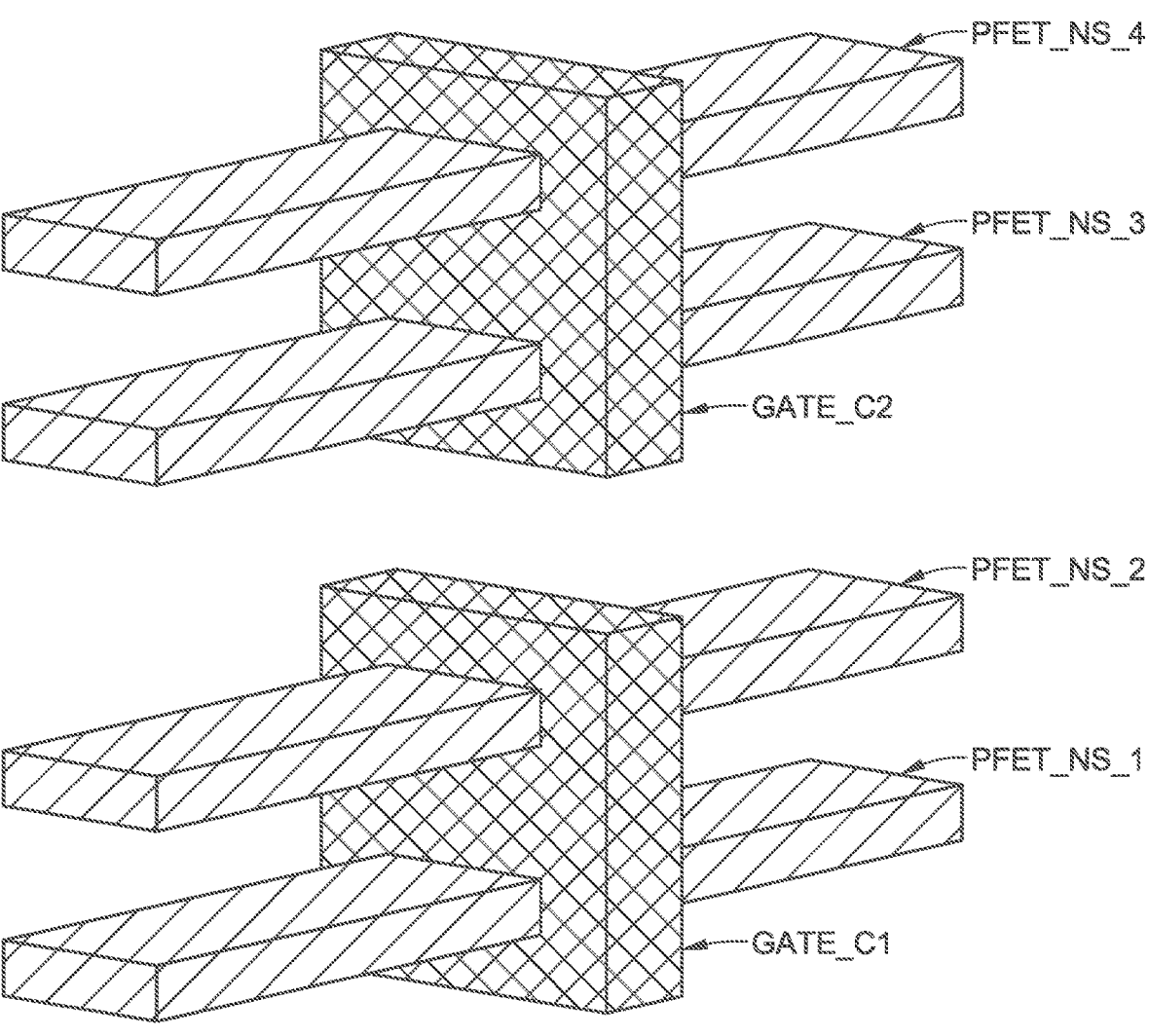
Figure 4H:
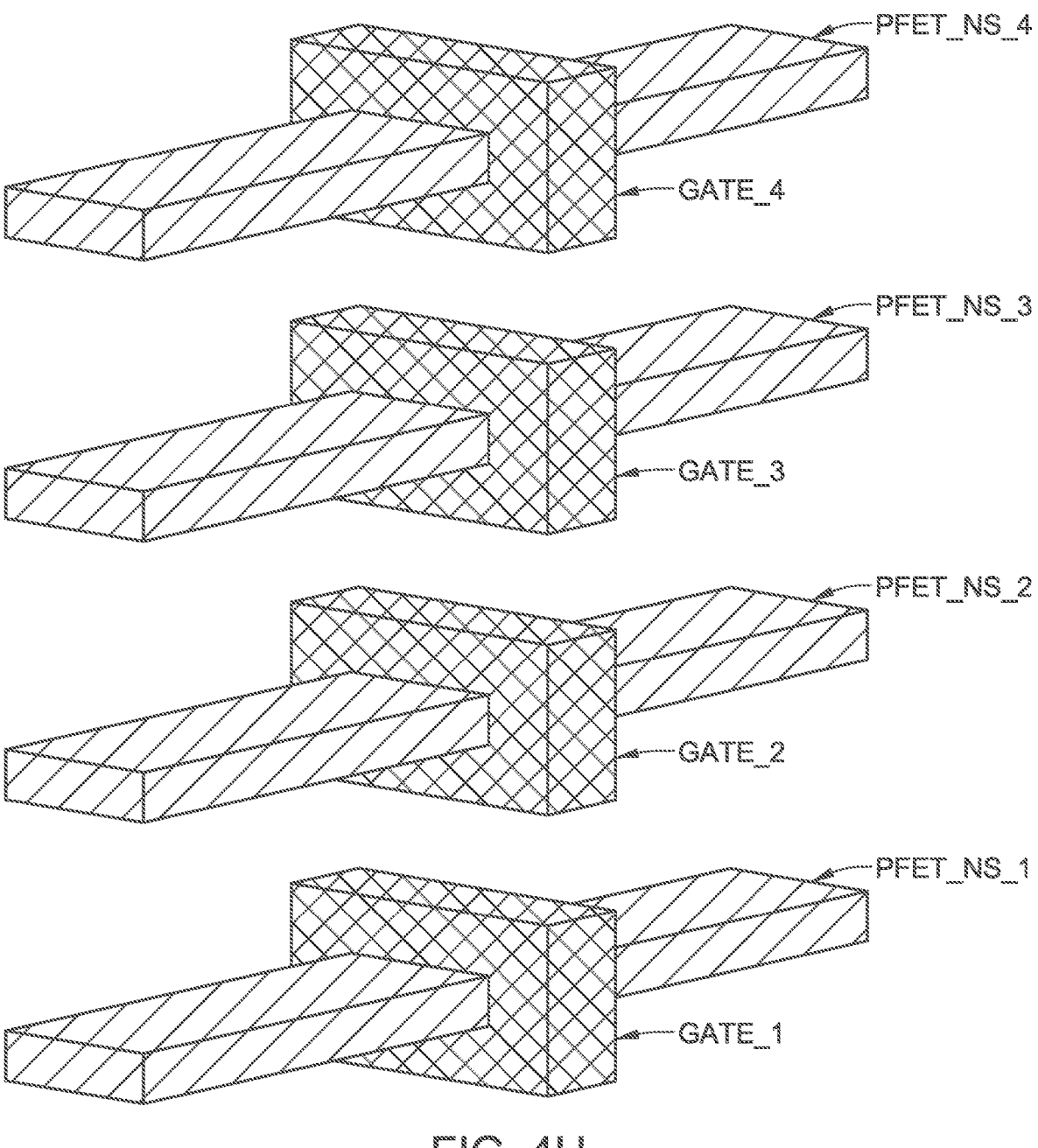
Figure 4I:
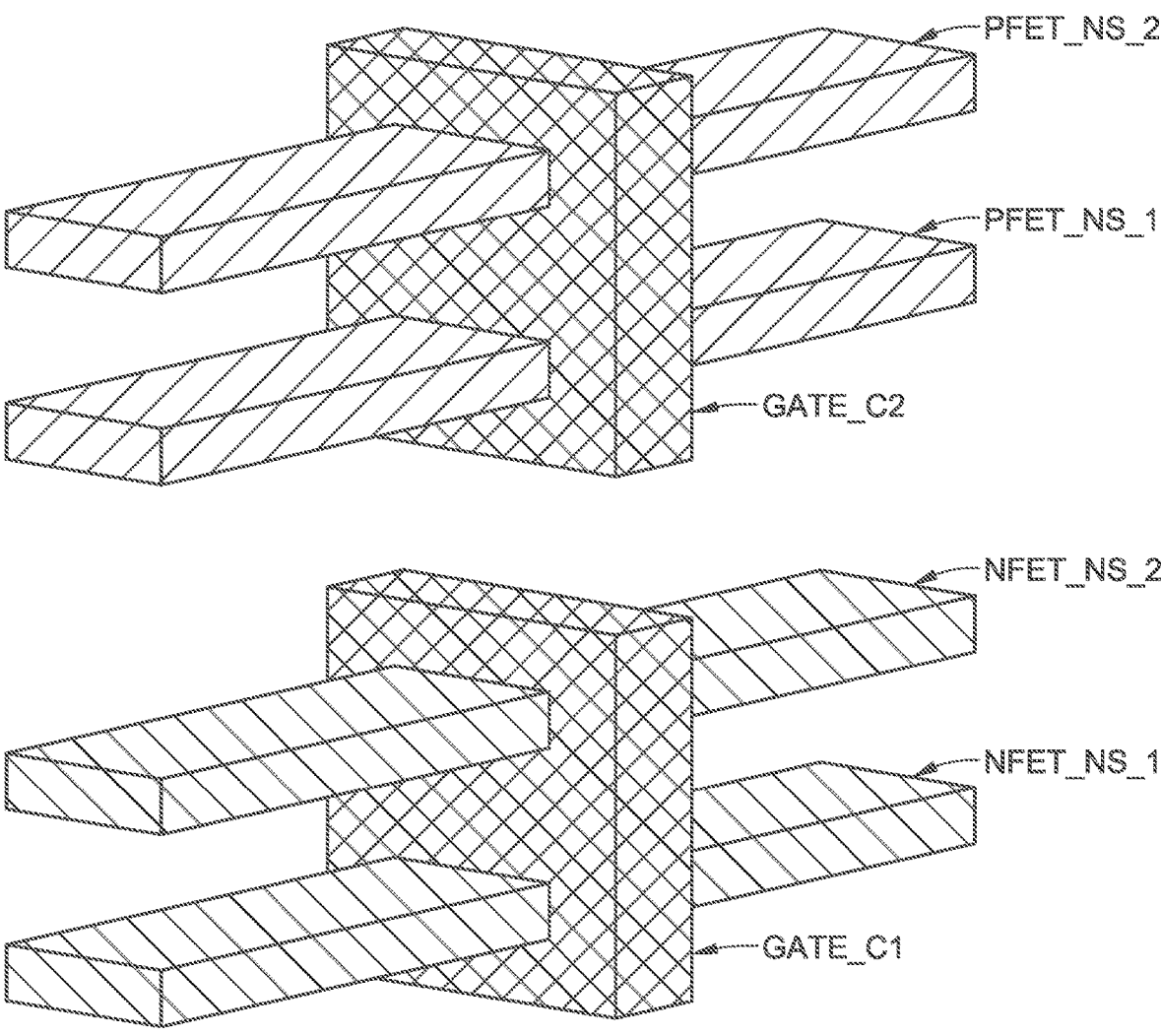
Figure 4J:
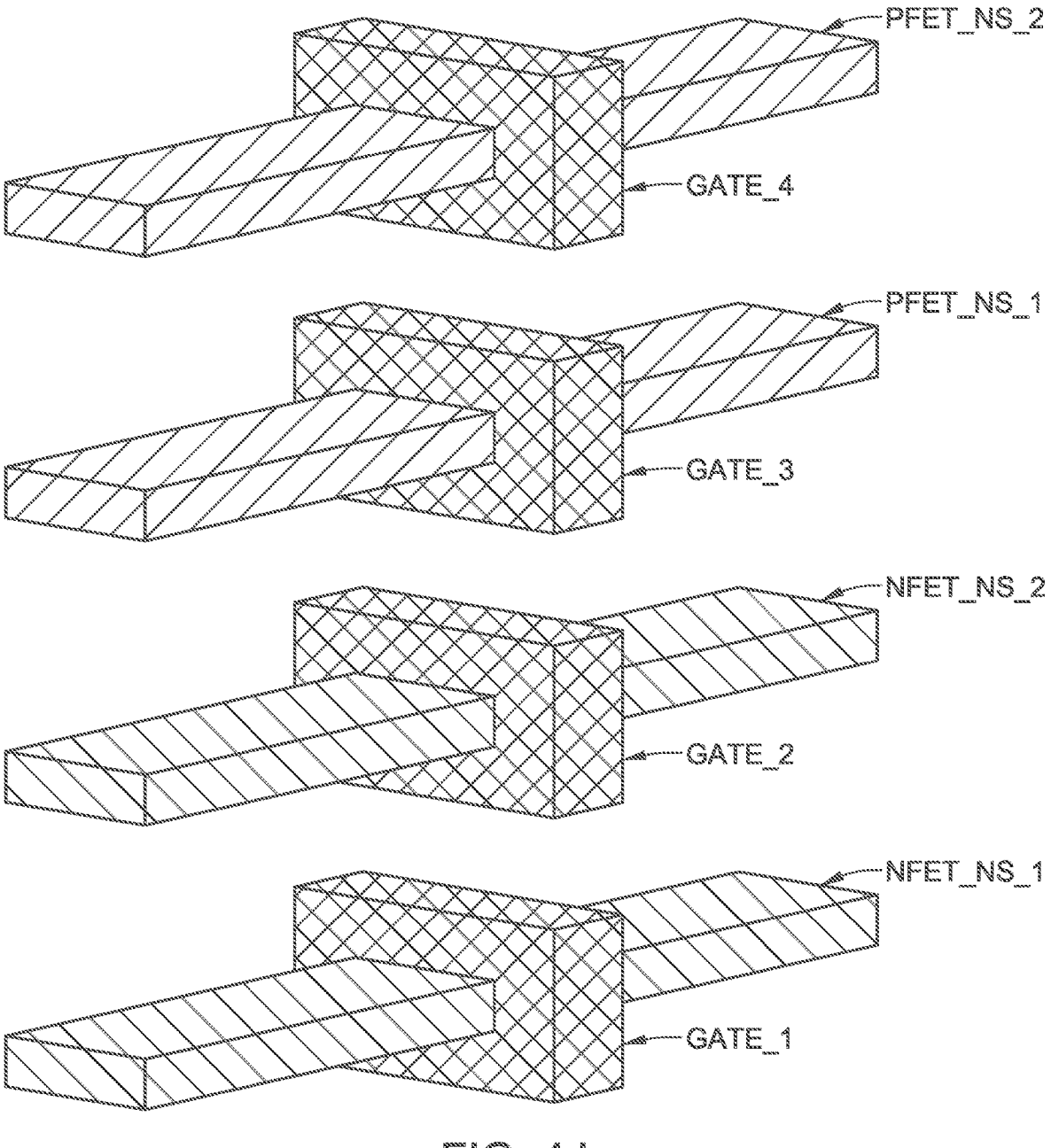
Figure 4K:
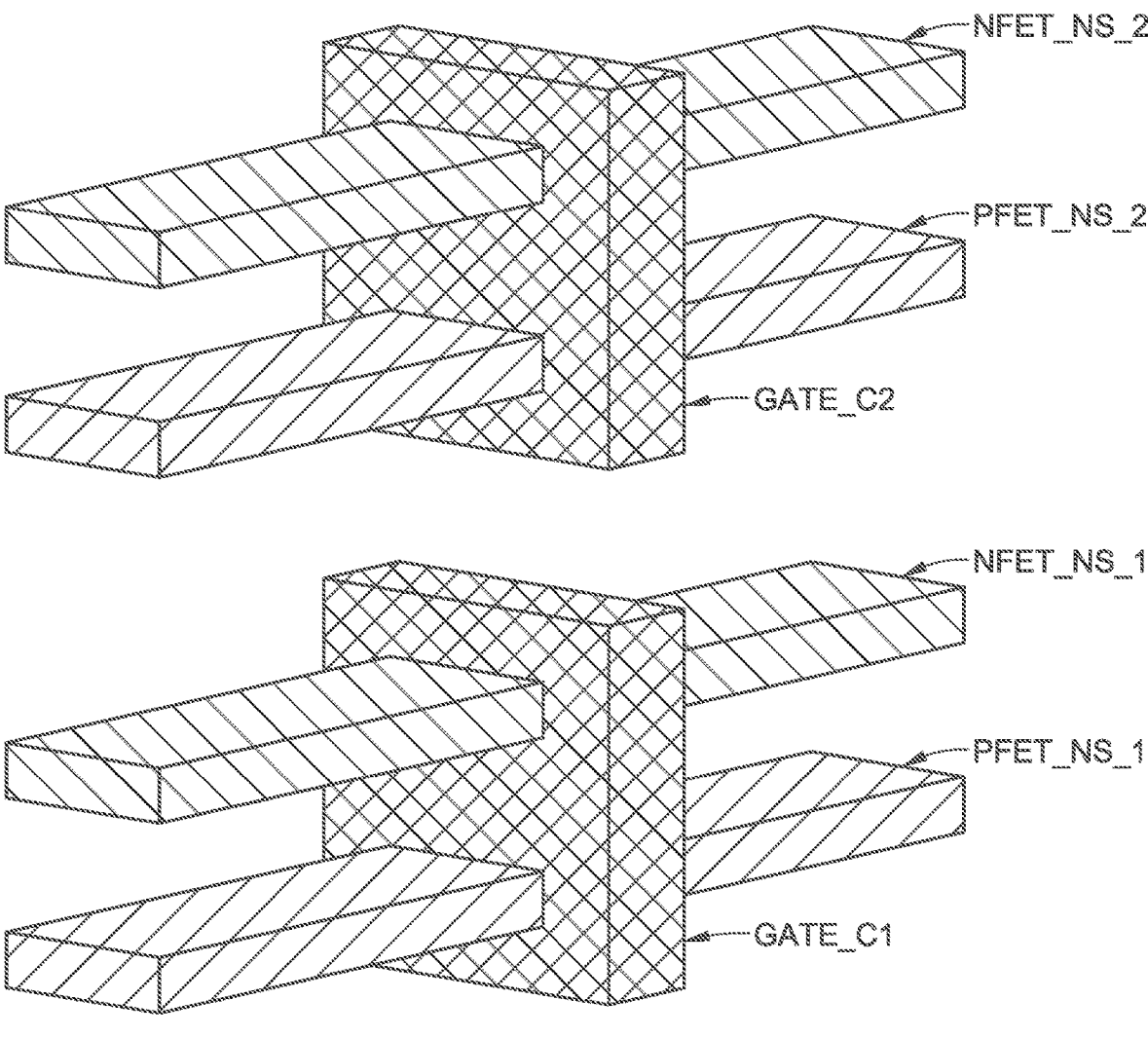
Figure 4L:
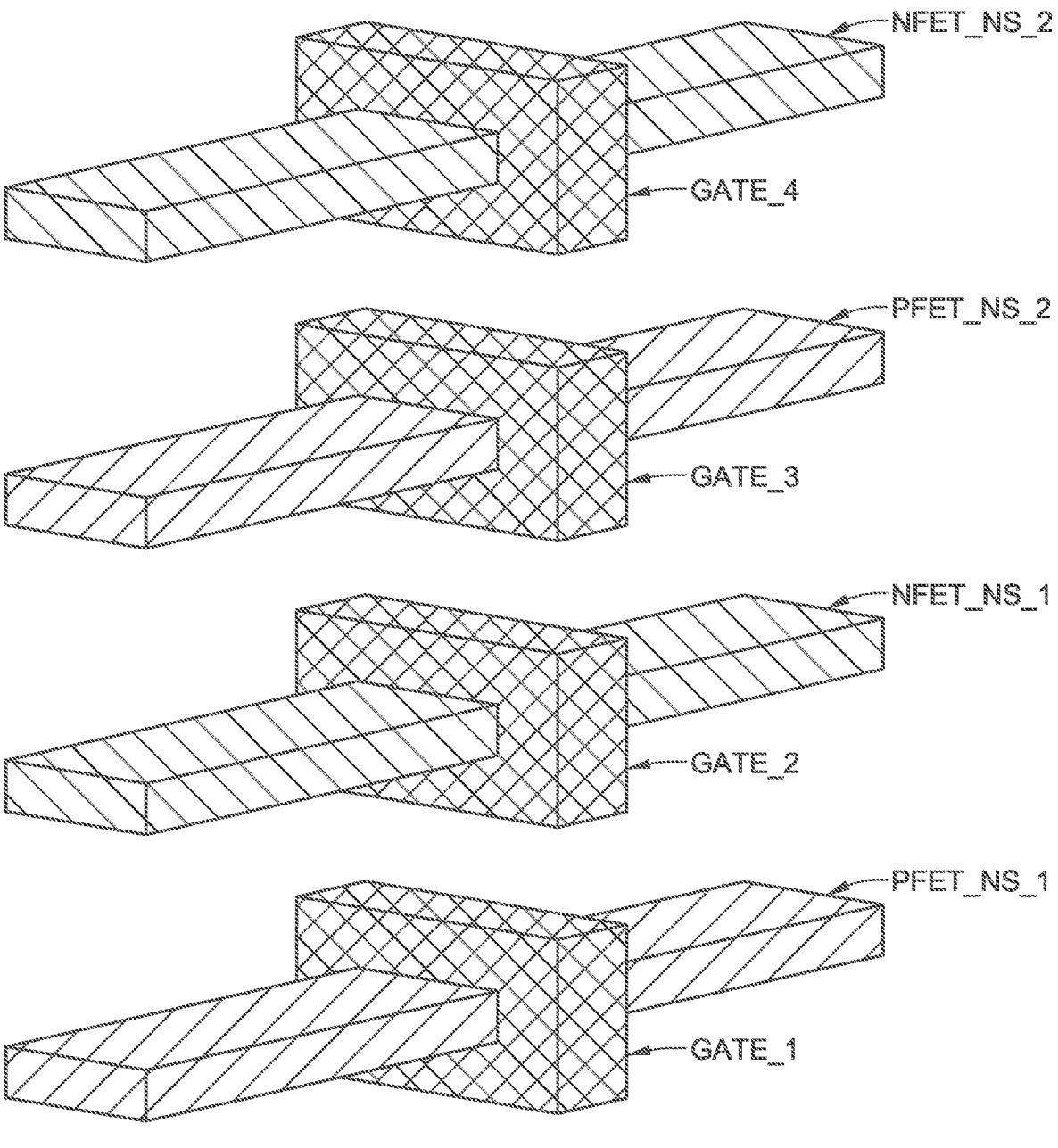
Figure 4M:
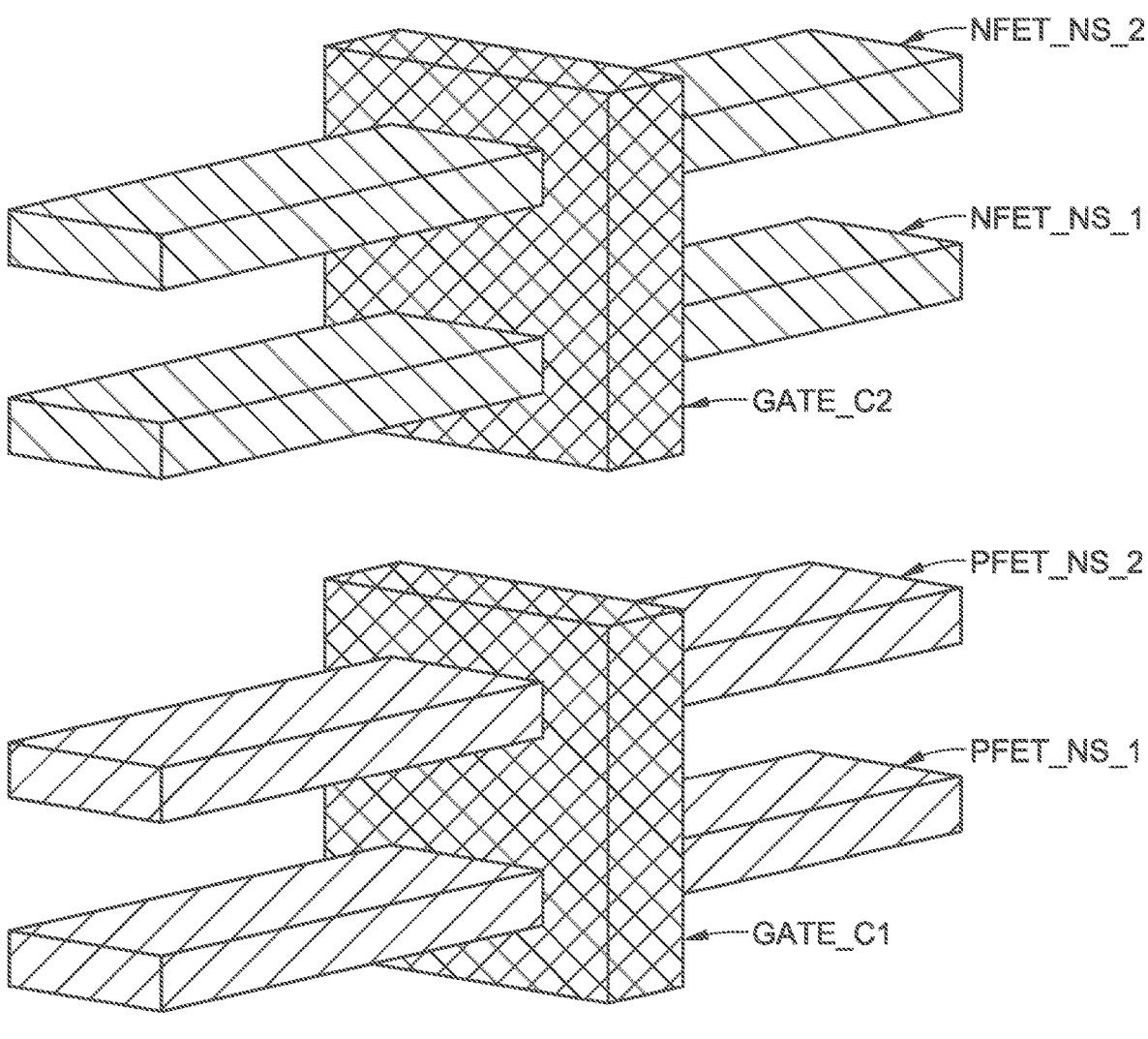
Figure 4N:
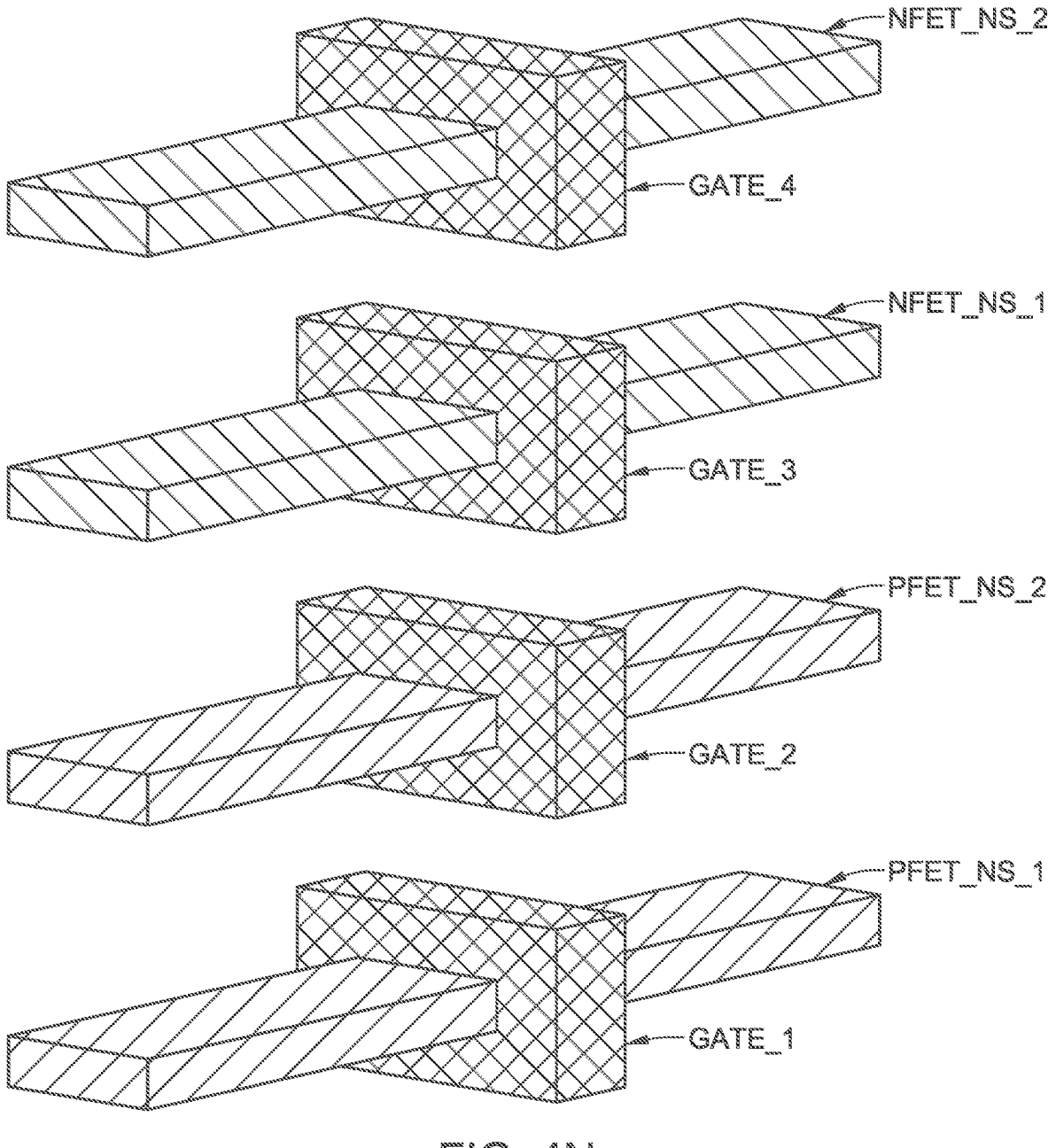
Figure 4O:
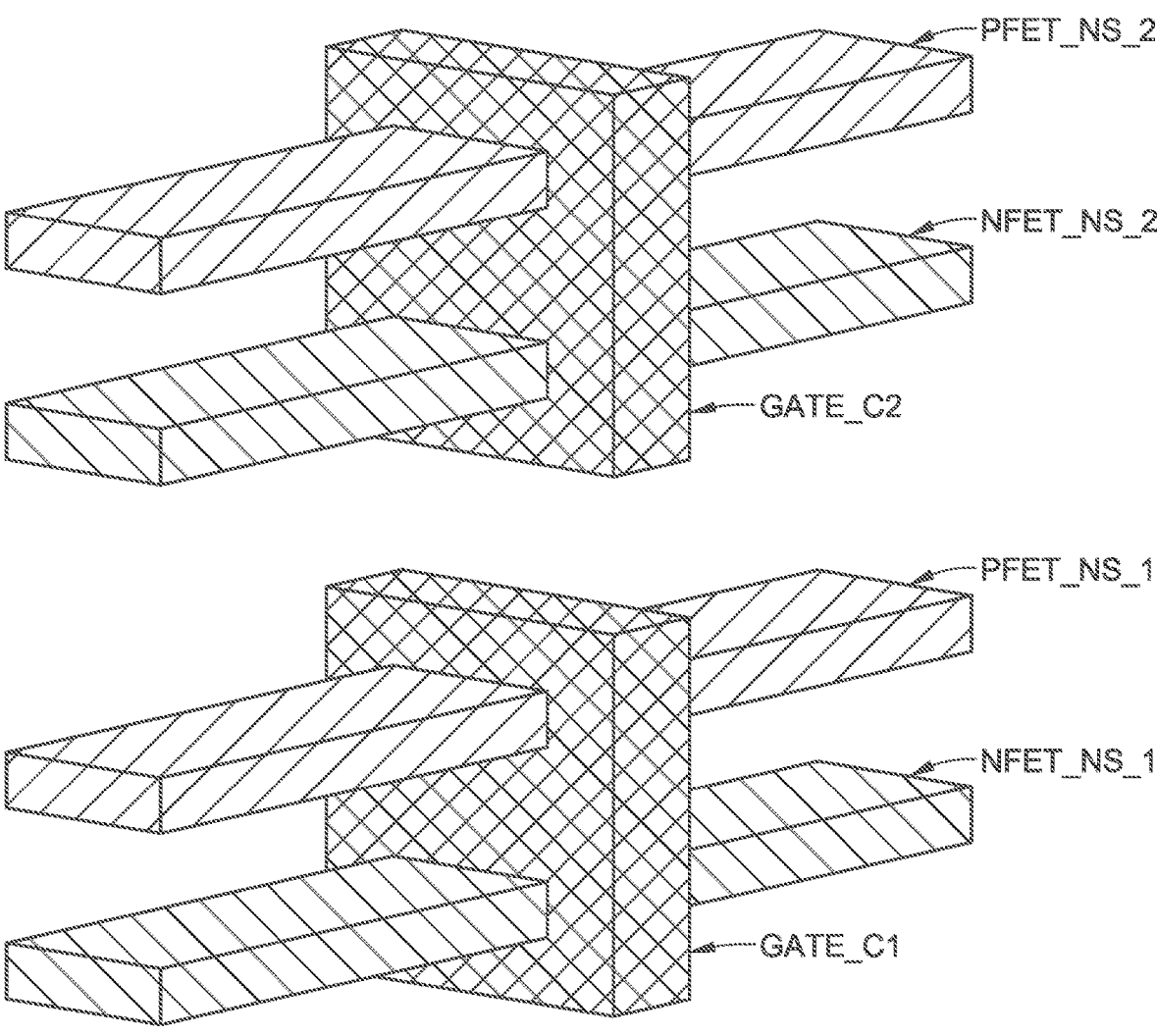
Figure 4P:
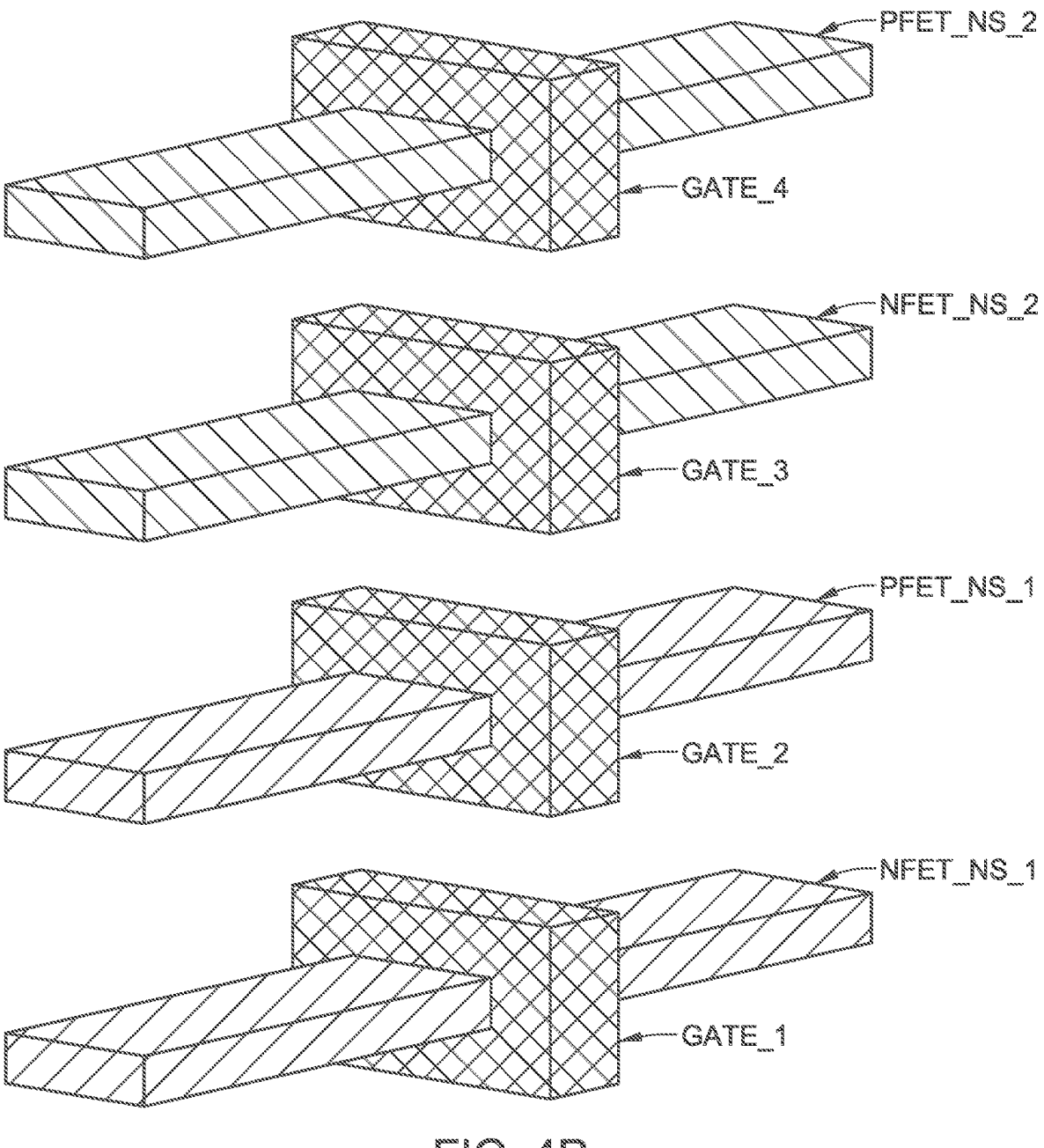

FIGS. 4A-4P illustrate various diagrams of multi-transistor stack architecture in multi-device stack configurations, such as, e.g., 4T stack configurations, in accordance with various implementations described herein. In particular, FIGS. 4A, 4C, 4E, 4G, 4I, 4K, 4M and 4O show various diagrams of a multi-transistor stack with dual-common-gate architecture, and in addition, FIGS. 4B, 4D, 4F, 4H, 4J, 4L, 4N and 4P show various diagrams of the multi-transistor stack with a split-gate architecture.

As shown in FIG. 4A, the P-over-N-over-N-over-P (PNNP) dual-common-gate related transistor architecture 404A may include multiple transistors (e.g., 2 PFET devices and 2 NFET devices) that are arranged in a multi-transistor stack configuration. In some instances, a first PFET may be formed in a first PFET nano-sheet (PFET_NS_1), and a second PFET may be formed in a second PFET nano-sheet (NFET_NS_2), which may be disposed vertically in a single stack. Also, a first NFET may be formed in a first NFET nano-sheet (NFET_NS_1), and a second NFET may be formed in a second NFET nano-sheet (NFET_NS_2), which may be disposed vertically in the same single stack with the PFET devices. The common-gate architecture 404A may include multiple common-gates (e.g., dual poly gate lines) coupled to the multiple transistors. In some instances, a first common-gate (GATE_C1) may be coupled to the PFET_NS_1 device and NFET_NS_1 device, and also, a second common-gate (GATE_C2) may be coupled to the NFET_NS_2 device and PFET_NS_2 device. This multi-device stack arrangement provides the PNNP stack configuration as a four-FET stacked device that is manufactured and/or formed in a same single monolithic semiconductor die or in a sequential manner. Further, in some instances, the pair of N-type devices may be disposed between the pair of P-type devices in the multi-transistor stack architecture 404A along with the dual-common-gate structure.

As shown in FIG. 4B, the P-over-N-over-N-over-P (PNNP) split-gate related transistor architecture 404B may include multiple transistors (e.g., 2 PFET devices and 2 NFET devices) arranged in a multi-transistor stack configuration. In various instances, a first PFET may be formed in a first PFET nano-sheet (PFET_NS_1), and a second PFET may be formed in a second PFET nano-sheet (PFET_NS_2), which may be disposed vertically in a single stack. In addition, a first NFET may be formed in a first NFET nano-sheet (NFET_NS_1), and a second NFET may be formed in a second NFET nano-sheet (NFET_NS_2), which may be disposed vertically in the same single stack along with the two PFET devices. The split-gate architecture 404B may include multiple split-gates (e.g., multiple poly gate lines) coupled to the multiple transistors. In some instances, a first gate (GATE_1) may be coupled to the PFET_NS_1 device, a second gate (GATE_2) may be coupled to the NFET_NS_1 device, a third gate (GATE_3) may be coupled to the NFET_NS_2 device, and a fourth gate (GATE_4) may be coupled to the PFET_NS_2 device. This multi-device stack arrangement provides the PNNP stack configuration as a four-FET stacked device that is manufactured and/or formed in a same single monolithic semiconductor die or in a sequential manner. Also, in some instances, the pair of N-type devices may be disposed between the pair of P-type devices in the multi-transistor stack architecture 404B along with the quad-split-gate structure.

As shown in FIG. 4C, the N-over-P-over-P-over-N (NPPN) dual-common-gate related transistor architecture 404C may include multiple transistors (e.g., 2 NFET devices and 2 PFET devices) that are arranged in a multi-transistor stack configuration. In some instances, a first NFET may be formed in a first NFET nano-sheet (NFET_NS_1), and a second NFET may be formed in a second NFET nano-sheet (NFET_NS_2), which may be disposed vertically in a single stack. Also, a first PFET may be formed in a first PFET nano-sheet (PFET_NS_1), and a second PFET may be formed in a second PFET nano-sheet (PFET_NS_2), which may be disposed vertically in the same single stack with the NFET devices. The common-gate architecture 404C may have multiple common-gates (e.g., dual poly gate lines) coupled to the multiple transistors. In some instances, a first common-gate (GATE_C1) may be coupled to the NFET_NS_1 device and PFET_NS_1 device, and also, a second common-gate (GATE_C2) may be coupled to the PFET_NS_2 device and NFET_NS_2 device. This multi-device stack arrangement provides the NPPN stack configuration as a four-FET stacked device that is manufactured and/or formed in a same single monolithic semiconductor die or in a sequential manner. Further, in some instances, the pair of P-type devices may be disposed between the pair of N-type devices in the multi-transistor stack architecture 404C along with the dual-common-gate structure.

As shown in FIG. 4D, the N-over-P-over-P-over-N (NPPN) split-gate related transistor architecture 404D may include multiple transistors (e.g., 2 NFET devices and 2 PFET devices) arranged in a multi-transistor stack configuration. In various instances, a first NFET may be formed in a first NFET nano-sheet (NFET_NS_1), and a second NFET may be formed in a second NFET nano-sheet (NFET_NS_2), which may be disposed vertically in a single stack. In addition, a first PFET may be formed in a first PFET nano-sheet (PFET_NS_1), and a second PFET may be formed in a second PFET nano-sheet (PFET_NS_2), which may be disposed vertically in the same single stack along with the two NFET devices. The split-gate architecture 404D may include multiple split-gates (e.g., multiple poly gate lines) coupled to the multiple transistors. In some instances, a first gate (GATE_1) may be coupled to the NFET_NS_1 device, a second gate (GATE_2) may be coupled to the PFET_NS_1 device, a third gate (GATE_3) may be coupled to the PFET_NS_2 device, and a fourth gate (GATE_4) may be coupled to the NFET_NS_2 device. This multi-device stack arrangement provides the NPPN stack configuration as a four-FET stacked device that is manufactured and/or formed in a same single monolithic semiconductor die or in a sequential manner. Also, in some instances, the pair of P-type devices may be disposed between the pair of N-type devices in the multi-transistor stack architecture 404D along with the quad-split-gate structure.

As shown in FIG. 4E, the N-over-N-over-N-over-N (NNNN) dual-common-gate related transistor architecture 404E may include multiple transistors (e.g., 4 NFET devices) that are arranged in a multi-transistor stack configuration. In some instances, a first NFET may be formed in a first NFET nano-sheet (NFET_NS_1), and a second NFET may be formed in a second NFET nano-sheet (NFET_NS_2), which may be disposed vertically in a single stack. Also, in some instances, a third NFET may be formed in a third NFET nano-sheet (NFET_NS_3), and a fourth NFET may be formed in a fourth NFET nano-sheet (NFET_NS_4), which may be disposed vertically in the same single stack with the other NFET devices. The common-gate architecture 404E includes multiple common-gates (e.g., dual poly gate lines) coupled to the multiple transistors. In some instances, a first common-gate (GATE_C1) may be coupled to NFET_NS_1 device and NFET_NS_2 device, and also, a second common-gate (GATE_C2) may be coupled to the NFET_NS_3 device and NFET_NS_4 device. This multi-device stack arrangement provides the NNNN stack configuration as a four-FET stacked device that is manufactured and/or formed in a same single monolithic semiconductor die or in a sequential manner. Further, in some instances, the quad-stack of N-type devices may be vertically disposed in the multi-transistor stack architecture 404E along with the dual-common-gate structure.

As shown in FIG. 4F, the N-over-N-over-N-over-N (NNNN) quad-split-gate related transistor architecture 404F may have multiple transistors (e.g., 4 NFET devices) arranged in a multi-transistor stack configuration. In various instances, a first NFET may be formed in a first NFET nano-sheet (NFET_NS_1), and a second NFET may be formed in a second NFET nano-sheet (NFET_NS_2), which may be disposed vertically in a single stack. Also, a third NFET may be formed in a third NFET nano-sheet (NFET_NS_3), and a fourth NFET may be formed in a fourth NFET nano-sheet (NFET_NS_4), which may be disposed vertically in the same single stack with the other NFET devices. The split-gate architecture 404F may include multiple split-gates (e.g., multiple poly gate lines) coupled to the multiple transistors. In various instances, a first gate (GATE_1) may be coupled to the NFET_NS_1 device, a second gate (GATE_2) may be coupled to the NFET_NS_2 device, a third gate (GATE_3) may be coupled to the NFET_NS_3 device, and a fourth gate (GATE_4) may be coupled to the NFET_NS_4 device. Also, this multi-device stack arrangement provides the NNNN stack configuration as a four-FET stacked device that is manufactured and/or formed in a same single monolithic semiconductor die or in a sequential manner. Further, in some instances, the quad-stack of N-type devices may be vertically disposed in the multi-transistor stack architecture 404F along with the quad-split-gate structure.

As shown in FIG. 4G, the P-over-P-over-P-over-P (PPPP) dual-common-gate related transistor architecture 404G may have multiple transistors (e.g., 4 PFET devices) that are arranged in a multi-transistor stack configuration. In some instances, a first PFET may be formed in a first PFET nano-sheet (PFET_NS_1), and a second PFET may be formed in a second PFET nano-sheet (PFET_NS_2), which may be disposed vertically in a single stack. Also, in various instances, a third PFET may be formed in a third PFET nano-sheet (PFET_NS_3), and a fourth PFET may be formed in a fourth PFET nano-sheet (PFET_NS_4), which may be disposed vertically in the same single stack with the other PFET devices. The common-gate architecture 404G has multiple common-gates (e.g., dual poly gate lines) coupled to the multiple transistors. In various instances, a first common-gate (GATE_C1) may be coupled to PFET_NS_1 device and the PFET_NS_2 device, and also, a second common-gate (GATE_C2) may be coupled to the PFET_NS_3 device and the PFET_NS_4 device. This multi-device stack arrangement may provide the PPPP stack configuration as a four-FET stacked device that is manufactured and/or formed in a same single monolithic semiconductor die or in a sequential manner. Moreover, in some instances, the quad-stack of P-type devices may be vertically disposed together in the multi-transistor stack architecture 404G along with the dual-common-gate structure.

As shown in FIG. 4H, the P-over-P-over-P-over-P (PPPP) quad-split-gate related transistor architecture 404H may have multiple transistors (e.g., 4 PFET devices) arranged in a multi-transistor stack configuration. In various instances, a first PFET may be formed in a first PFET nano-sheet (PFET_NS_1), and a second PFET may be formed in a second PFET nano-sheet (PFET_NS_2), which may be disposed vertically in a single stack. Also, a third PFET may be formed in a third PFET nano-sheet (PFET_NS_3), and a fourth PFET may be formed in a fourth PFET nano-sheet (PFET_NS_4), which may be disposed vertically in the same single stack with the other PFET devices. The split-gate architecture 404H may include multiple split-gates (e.g., multiple poly gate lines) coupled to the multiple transistors. In various instances, a first gate (GATE_1) may be coupled to the PFET_NS_1 device, a second gate (GATE_2) may be coupled to the PFET_NS_2 device, a third gate (GATE_3) may be coupled to the PFET_NS_3 device, and a fourth gate (GATE_4) may be coupled to the PFET_NS_4 device. Also, this multi-device stack arrangement provides the PPPP stack configuration as a four-FET stacked device that is manufactured and/or formed in a same single monolithic semiconductor die or in a sequential manner. Further, in some instances, the quad-stack of P-type devices may be vertically disposed in the multi-transistor stack architecture 404H along with the quad-split-gate structure.

In some implementations, based on the foregoing description provided herein above in reference to FIGS. 4A-4H, the various multi-transistor fabrication schemes and techniques described herein may be utilized to implement various other multi-transistor stack configurations as shown in FIGS. 4I-4P.

For instance, as shown in FIG. 4I, an NNPP common-gate related transistor architecture 404I may provide for multiple transistors (e.g., 2 NFET devices and 2 PFET devices) arranged in a multi-transistor stack configuration. In some instances, the NNPP transistor architecture 404I may refer to a P-over-P-over-N-over-N stack structure. Also, as shown in FIG. 4J, an NNPP split-gate related transistor architecture 404J may have multiple transistors (e.g., 2 NFET devices and 2 PFET devices) arranged in another multi-transistor stack configuration. In some instances, the NNPP transistor architecture 404J may refer to a P-over-P-over-N-over-N stack structure.

As shown in FIG. 4K, a PNPN common-gate related transistor architecture 404K may provide for multiple transistors (e.g., 2 NFET devices and 2 PFET devices) arranged in a multi-transistor stack configuration. In some instances, the PNPN transistor architecture 404K may refer to an N-over-P-over-N-over-P stack structure. Further, as shown in FIG. 4K, a PNPN split-gate related transistor architecture 404L may have multiple transistors (e.g., 2 NFET devices and 2 PFET devices) arranged in another multi-transistor stack configuration. In some instances, the PNPN transistor architecture 404L may refer to an N-over-P-over-N-over-P stack structure.

As shown in FIG. 4M, a PPNN common-gate related transistor architecture 404M may provide for multiple transistors (e.g., 2 NFET devices and 2 PFET devices) arranged in a multi-transistor stack configuration. In some instances, the PPNN transistor architecture 404M may refer to an N-over-N-over-P-over-P stack structure. Further, as shown in FIG. 4N, a PPNN split-gate related transistor architecture 404N may have multiple transistors (e.g., 2 NFET devices and 2 PFET devices) arranged in another multi-transistor stack configuration. In some instances, the PPNN transistor architecture 404N may refer to an N-over-N-over-P-over-P stack structure.

As shown in FIG. 4O, an NPNP common-gate related transistor architecture 404O may provide for multiple transistors (e.g., 2 NFET devices and 2 PFET devices) arranged in a multi-transistor stack configuration. In some instances, the NPNP transistor architecture 404O may refer to a P-over-N-over-P-over-N stack structure. Further, as shown in FIG. 4P, a NPNP split-gate related transistor architecture 404P may have multiple transistors (e.g., 2 NFET devices and 2 PFET devices) arranged in another multi-transistor stack configuration. In some instances, the NPNP transistor architecture 404P may refer to a P-over-N-over-P-over-N stack structure.

The various implementations described herein refer to fabrication schemes and techniques that provide for various multi-transistor stack architectures in various physical layout designs for multi-transistor stack applications. In various instances, FIGS. 3A-3H provide for a two-transistor (e.g., 2T) stack architecture in the same, single vertical stack, and further, FIGS. 4A-4H provide for a four-transistor (e.g., 4T) stack architecture in the same, single vertical stack. Also, the various implementations described herein refer to a method for manufacturing, and/or causing to be manufactured, multiple devices packaged within a single semiconductor die. The multiple devices may have a number (F) of first devices (e.g., Ftransistors) that are arranged in a first multi-transistor stack with a first P-N configuration, and also, the multiple devices may include a number (S) of second devices (e.g., Stransistors) arranged in a second multi-transistor stack with a second P-N configuration that is different than the first P-N configuration.

In some implementations, each of the first multi-transistor stack and the second multi-transistor stack may be arranged in the same, single vertical stack with the common-gate architecture. Also, in other implementations, each of the first multi-transistor stack and the second multi-transistor stack may be arranged in the same, single vertical stack with the split-gate architecture. However, in various implementations, any type of different combinations may be used that seek to combine common-gate multi-transistor structures with split-gate multi-transistor structures. In some instances, a first multi-transistor stack may have a first two-transistor stack, and the second multi-transistor stack may have a second two-transistor stack. The first P-N configuration may refer to at least one of a P-over-N (PN) configuration, an N-over-P (NP) configuration, a P-over-P (PP) configuration, and an N-over-N(NN) configuration. The second P-N configuration may refer to at least one of a P-over-N (PN) configuration, an N-over-P (NP) configuration, a P-over-P (PP) configuration, and an N-over-N(NN) configuration. Also, in some instances, the first devices refer to first field-effect transistor (FET) devices including at least one of an N-type FET (NFET) and a P-type FET (PFET). Also, in some instances, the second devices refer second field-effect transistors (FET) including at least one of an N-type FET (NFET) and a P-type FET (PFET).

Various implementations described herein provide for multi-device stack circuit architecture, such as, e.g., a sense amplifier (SA), in 3D designs. For instance, various devices may be provided that have a multi-transistor structure for use in the circuit architecture. The multi-transistor structure may include a multi-transistor stack of N-type transistors that are arranged in a multi-device stack configuration, and a physical layout of the multi-device stack configuration may provide a common-centroid configuration for process mismatch cancellation in at least one of the X-Y-Z axes. In other instances, various process mismatch cancellation schemes and techniques described herein may be used to for process mismatch cancellation in PMOS transistor applications.

In some implementations, the multi-transistor structure may be formed within a single monolithic semiconductor die or in a sequential manner, and the multi-transistor stack of N-type transistors may be formed within the single monolithic semiconductor die or in a sequential manner, and the circuit architecture may refer to a three-dimensional (3D) circuit architecture. The circuit architecture may be used in at least one of a sense amplifier and a memory architecture. In various scenarios, the multi-device stack configuration may have a two-device stack configuration of N-type transistors arranged in an N-over-N(NN) stack configuration, and the N-type transistors in the NN stack configuration may be a matched pair of N-type transistors. In some other scenarios, the multi-device stack configuration may have a four-device stack configuration of N-type transistors arranged in an N-over-N-over-N-over-N(NNNN) stack configuration, and also, at least two of the N-type transistors in the NNNN stack configuration may be a matched pair of N-type transistors. Moreover, in various instances, the N-type transistors may be N-type field-effect transistors (NFETs).

Figure 5A:
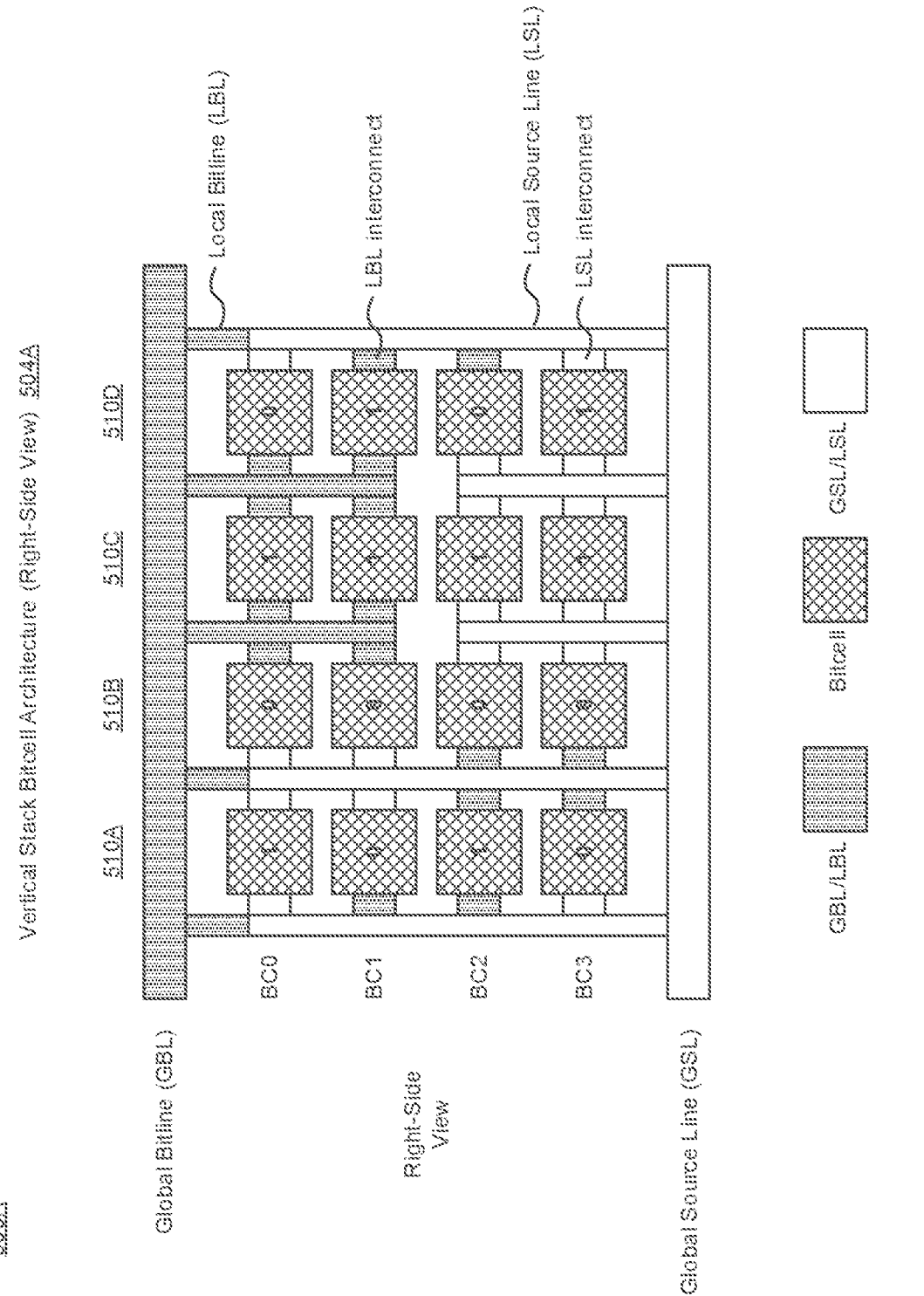
FIGS. 5A-5B illustrate various diagrams of a physical layout for multi-device stack configuration that provides a vertical stack bitcell architecture in accordance with implementations described herein.
Figure 5B:
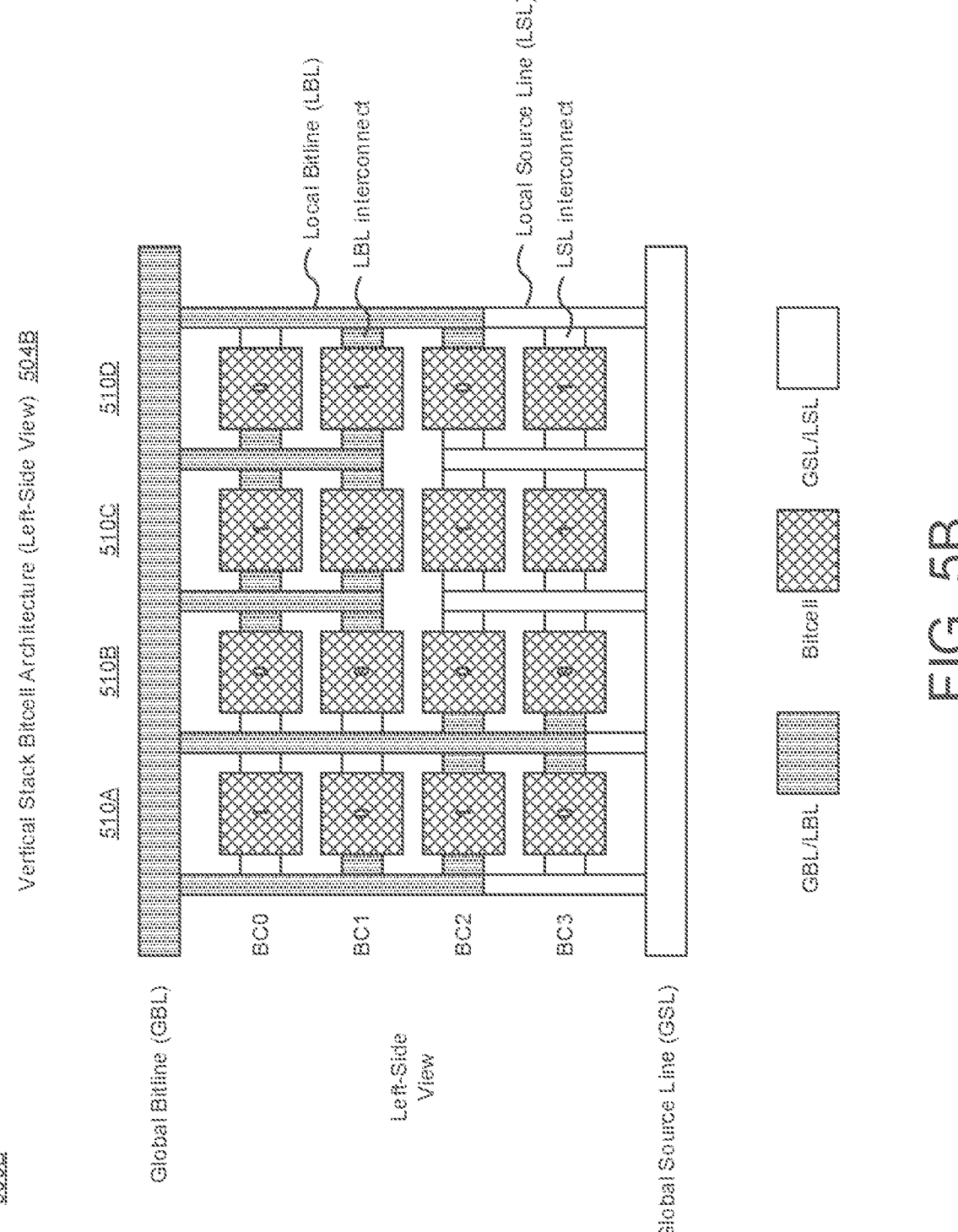

FIGS. 5A-5B illustrate various diagrams of a physical layout for multi-device stack configuration that provides a vertical stack bitcell architecture in accordance with various implementations described herein. In particular, FIG. 5A shows a diagram 504A of a physical layout for multi-device stack configuration that provides a vertical stack bitcell architecture 504A, and FIG. 5B shows a diagram 504B of a physical layout for multi-device stack configuration that provides a vertical stack bitcell architecture 504B.

In some instances, FIG. 5A shows a right-side view (or frontside view) of the vertical stack bitcell architecture 504A, and FIG. 5B shows a left-side view (or backside view) of the vertical stack bitcell architecture 504B that is an opposite view of the same configuration of the vertical stack bitcell architecture 504A in FIG. 5A.

In various implementations, multi-stack bitcell architecture may be implemented as a system or device having various integrated circuit (IC) components that are arranged and coupled together as an assemblage or some combination of parts that may provide for physical circuit designs and various related structures. In some instances, a method of designing, providing and fabricating the multi-stack bitcell architecture as an integrated system or device may involve use of various IC circuit components described herein so as to thereby implement fabrication schemes and techniques associated therewith. Also, the multi-stack bitcell architecture may be integrated with computing circuitry and related components on a single chip, and the multi-stack bitcell architecture may be implemented in various embedded systems for automotive, electronic, mobile, server and/or Internet-of-things (IoT) applications, such as, e.g., remote sensor nodes.

As shown in FIG. 5A, in reference to a 3D framework, multiple transistors may be stacked (e.g., stack of 2 transistors, stack of 4 transistors, etc.) in the vertical direction, wherein a physical layout for a multi-device stack configuration provides the vertical stack bitcell architecture 504A. Also, in some applications, the vertical stack bitcell architecture 504A may have various conductive lines, such as, e.g., a global bitline (GBL) and a global source line (GSL) along with local bitlines (LBL) and local source lines (LSL). Also, due to a vertically stacked structure, local interconnects may include local bitline interconnects (LBL interconnects) and local source interconnects (LSL interconnects) that are used to couple the source/drain of transistors between each other and/or to various external lines, such as, e.g., frontside metal line (MO) and ground line (VSS), which may be a backside metal line (BMO). In some applications, when a buried power rail (BPR) is used, the GSL may be coupled to ground (VSS) by way of a buried backside ground line (BGL) that may be routed below the transistors, such as, e.g., within a substrate or insulator.

Also, in various implementations, the global bitline (GBL) may be referred to as a frontside conductive rail (or frontside metal rail), and the global source line (GSL) may be referred to as a buried conductive rail (or backside metal or power rail).

In some applications, as shown in FIG. 5A, the GBLs may be coupled to the bitcells by way of the LBL and the LBL interconnects so as to provide a conductive path from the GBLs to the bitcells. Also, the GSLs may be coupled to the bitcells by way of the LSL and the LSL interconnects so as to provide another conductive path from the GSLs to the bitcells. The GBLs and the GSLs are separate and distinct from one another.

In some implementations, as shown in FIG. 5A, the bitcell architecture 504A may refer to read-only memory (ROM) based bitcell architecture. In various applications, the bitcell architecture 504A may have columns 510A, 510B, 510C, 510D of bitcells with each bitcell (BC) having at least one transistor (T). For instance, a first column 510A may have multiple bitcells coupled in series, a second column 510B may have multiple bitcells coupled in series, a third column 510C may have multiple bitcells coupled in series, and a fourth column 510D may include multiple bitcells coupled in series. Also, depending on the bit programming, the GBL may be coupled to some bitcells in each column by way of the LGL and the LGL interconnects, and the GSL may be coupled to some bitcells in each column by way of the LSL and the LSL interconnects.

In reference to bit programming, each bitcell (BC) may be encoded with a logic one (1) or a logic zero (0) by way various programmable and/or configurable connections to the GBL and GSL. In some applications, the first column 510A of bitcells (BC) may be encoded as 1010 by coupling BC0 between GSL, by coupling BC1 between GBL and GSL, by coupling BC2 between GBL, and by coupling BC3 between GBL and GSL. Also, the second column 510B of bitcells (BC) may be encoded as 0000 bp coupling BC0 between GSL and GBL, by coupling BC1 between GSL and GBL, by coupling BC2 between GBL and GSL, and by coupling BC3 between GBL and GSL. Also, the third column 510C may be encoded as 1111 by coupling BC0 between GBL, by coupling BC1 between GBL, by coupling BC2 between GSL, and by coupling BC3 between GSL. Also, the fourth column 510D of bitcells (BC) may be encoded as 0101 by coupling BC0 between GSL and GBL, by coupling BC1 between GBL, by coupling BC2 between GSL, and by coupling BC3 between GSL.

In some implementations, in reference to FIG. 5A, transistors (BC0, BC1, BC2, BC3) may refer to N-type transistors. However, other configurations may be used (e.g., P-type transistors, or similar) to achieve similar results and/or behaviors.

In some implementations, as shown in FIG. 5B, the bitcell architecture 504B may refer to the same ROM based bitcell architecture as shown in FIG. 5A. In various applications, the bitcell architecture 504B may have the columns 510A, 510B, 510C, 510D of bitcells with each bitcell (BC) having the at least one transistor (T) in a manner as shown in the bitcell architecture 504A of FIG. 5A with the opposite view.

In reference to bit programming, each bitcell (BC) may be encoded with a logic one (1) or a logic zero (0) by way various programmable and/or configurable connections to the GBL and GSL. In some applications, the first column 510A of bitcells (BC) may be encoded as 1010 by coupling BC0 between GSL, by coupling BC1 between GBL and GSL, by coupling BC2 between GBL, and by coupling BC3 between GBL and GSL. Also, the second column 510B of bitcells (BC) may be encoded as 0000 by coupling BC0 between GSL and GBL, by coupling BC1 between GSL and GBL, by coupling BC2 between GBL and GSL, and by coupling BC3 between GBL and GSL. Also, the third column 510C may be encoded as 1111 by coupling BC0 between GBL, by coupling BC1 between GBL, by coupling BC2 between GSL, and by coupling BC3 between GSL. Also, the fourth column 510D of bitcells (BC) may be encoded as 0101 by coupling BC0 between GSL and GBL, by coupling BC1 between GBL, by coupling BC2 between GSL, and by coupling BC3 between GSL.

Figure 6A:
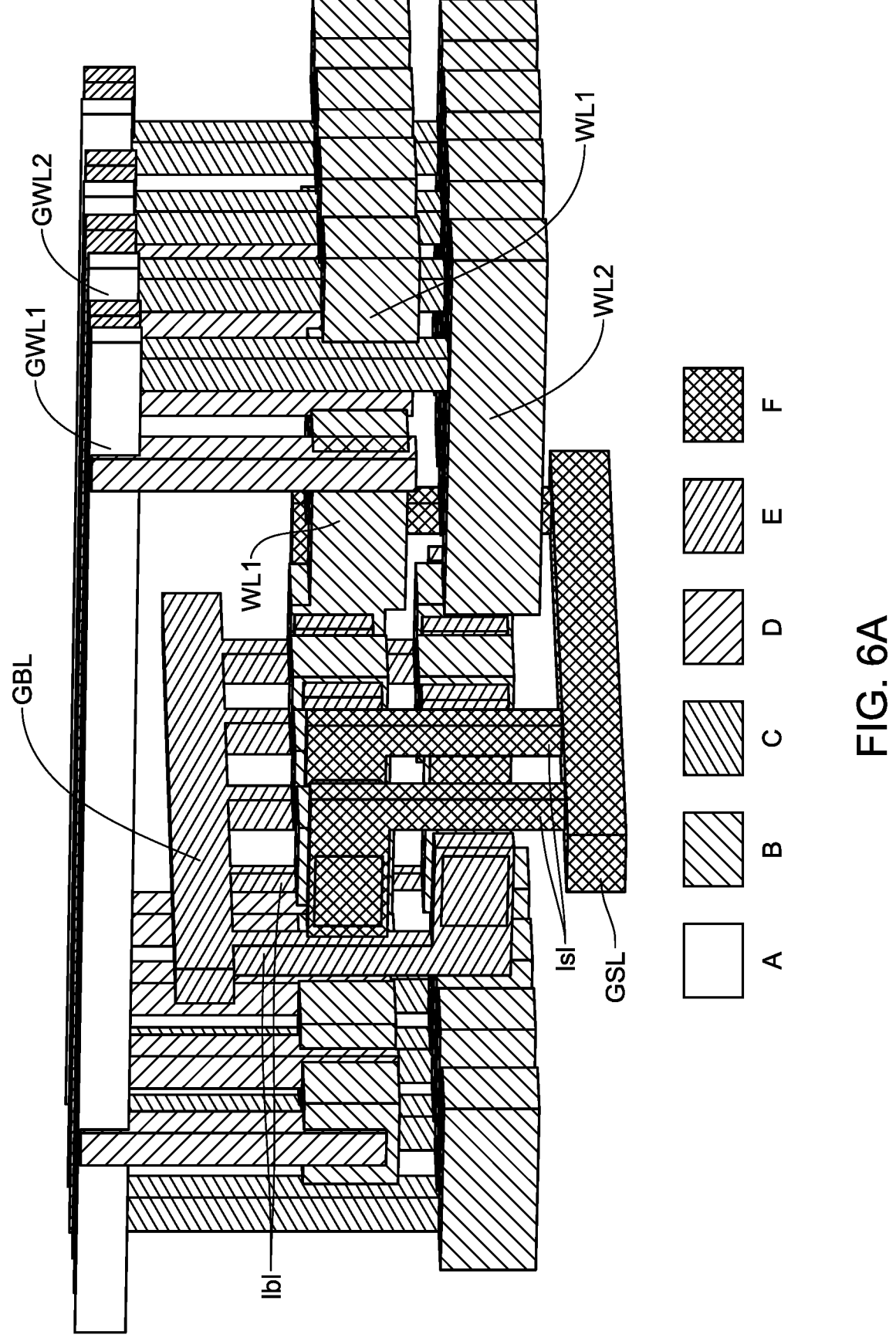
FIGS. 6A-6B illustrate various diagrams of a physical layout for multi-device stack configuration that provides a vertical stack bitcell architecture in accordance with implementations described herein.
Figure 6B:
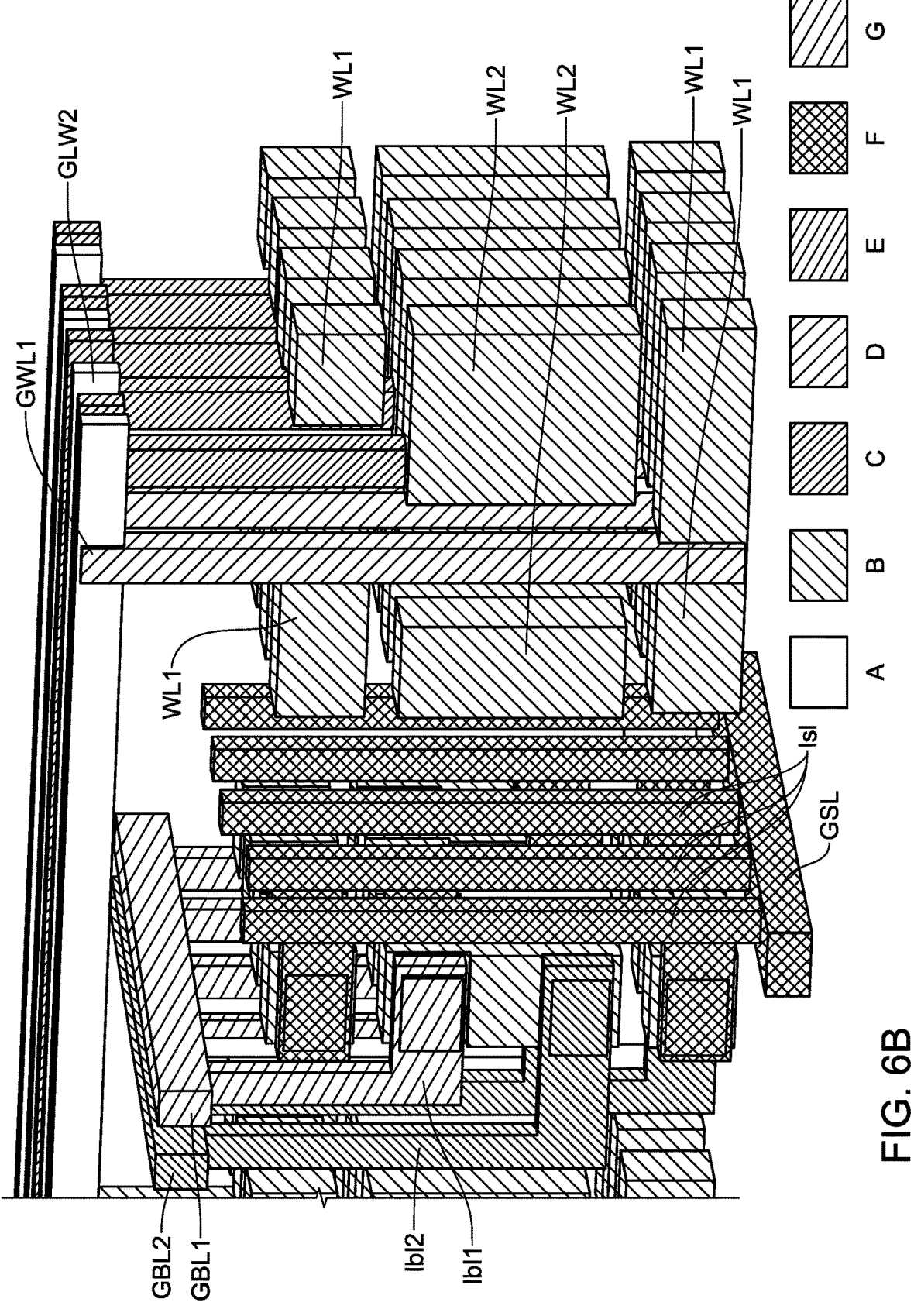

FIGS. 6A-6B illustrate various diagrams of a physical layout for multi-device stack configuration that provides a vertical stack bitcell architecture in accordance with various implementations described herein. In particular, FIG. 6A shows a diagram 604A of a physical layout for multi-device stack configuration that provides a vertical stack bitcell architecture 604A with global wordline (GWL) connections, and FIG. 6B shows another diagram 604B of a physical layout for multi-device stack configuration that provides a vertical stack bitcell architecture 604B with global wordline (GWL) connections.

In some instances, FIG. 6A shows a 3D view of the vertical multi-device stack bitcell architecture 604A (e.g., 2-device vertical stack), and FIG. 6B shows another 3D view of the vertical stack bitcell architecture 604B (e.g., 4-device vertical stack).

In various implementations, multi-stack bitcell architecture may be implemented as a system or device having various integrated circuit (IC) components that are arranged and coupled together as an assemblage or some combination of parts that may provide for physical circuit designs and various related structures. In some instances, a method of designing, providing and fabricating the multi-stack bitcell architecture as an integrated system or device may involve use of various IC circuit components described herein so as to thereby implement fabrication schemes and techniques associated therewith. Also, the multi-stack bitcell architecture may be integrated with computing circuitry and related components on a single chip, and the multi-stack bitcell architecture may be implemented in various embedded systems for automotive, electronic, mobile, server and/or Internet-of-things (IoT) applications, such as, e.g., remote sensor nodes.

As shown in FIG. 6A, in reference to a 3D framework, multiple transistors may be stacked (e.g., stack of 2 transistors, stack of 4 transistors, etc.) in the vertical direction, wherein a physical layout for a multi-device stack configuration provides the vertical stack bitcell architecture 604A. Also, in some applications, the vertical stack bitcell architecture 604A may have various conductive lines, such as, e.g., global wordlines (GWL), a global bitline (GBL) and a global source line (GSL) along with local wordlines (WL or LWL), local bitlines (LBL) and local source lines (LSL).

Also, due to a vertically stacked structure, the local interconnects may include local bitline interconnects (LBL interconnects) and local source interconnects (LSL interconnects) that are used to couple the source/drain of the transistors between each other and/or to various external lines, such as, e.g., a frontside metal line (MO) and a ground line (VSS), which may refer to a backside metal line (BMO). In some applications, when a buried power rail (BPR) is used, the GSL may be coupled to ground (VSS) by way of a buried backside ground line (BGL) that may be routed below the transistors, such as, e.g., within a substrate or insulator.

Also, in various implementations, the global wordline (GWL) may be referred to as a first frontside conductive rail (or frontside metal rail), the global bitline (GBL) may be referred to as a second frontside conductive rail (or frontside metal rail), and the global source line (GSL) may be referred to as a buried conductive rail (or backside metal or power rail). Also, in some instances, the GWL and GBL may be referred to as conductive signal lines or rails, and the GSL may be referred to as conductive power line or rail.

In some applications, as shown in FIG. 6A, the GWLs may be coupled to the bitcells by way of the WLs or LWLs so as to provide a conductive path from the GWLs to the bitcells. Also, the GBLs may be coupled to the bitcells by way of the LBL and the LBL interconnects so as to provide a conductive path from the GBLs to the bitcells. Also, the GSLs may be coupled to the bitcells by way of the LSL and the LSL interconnects so as to provide another conductive path from the GSLs to the bitcells. The GBLs and the GSLs are separate and distinct from one another.

In some implementations, in reference to ROM, as gate-poly is very resistive, the gates may need to be increased in size (e.g., double the size) with metal lines, such as, e.g., by implementing the global wordline (GWL). As such, the poly wordlines may be coupled to the global wordlines (GWL), wherein multiple global wordlines (GWL1, GWL2) may be coupled to corresponding wordlines (WL1, WL2) with vertical interconnects, e.g., as shown in FIG. 6A. In some instances, a first GWL1 may be provided above the multi-transistor stack to double a first poly wordline (WL1), and also, a second GWL2 may be provided above the multi-transistor stack to double a second poly wordline (WL2), wherein the GWL1/WL1 are separate and distinct form the GWL2/WL2.

When increasing a number of stack devices, depending on various metal rules, designers may find a configuration where there is not enough global metal line to double all of the poly WLs needed for a design. If additional stack devices are needed, then as shown in FIG. 6B, the GWLs may be doubled in parallel so that the GWL1 has double the conductive metal lines and so that the GWL2 has double the conductive metal lines, which considers at least two metal lines available for GWL1 and/or GWL2. Then, in some applications, the poly lines may be grouped together, which may multiply the numbers of bitlines (BLs), because the poly is to be shared, then the bitlines (BLs) need to be separate so as to not have 2 transistors for the same data/address. This may lead to area penalty, which is still smaller than when bitcells are not sharing drains.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a device having a memory architecture with a multi-stack of transistors arranged in a multi-bitcell stack configuration. Also, a wordline may be shared across the transistors of the multi-stack of transistors with each transistor coupled to a different bitline.

Described herein are various implementations of a device having a memory architecture with a multi-stack of transistors arranged in a multi-bitcell stack configuration. Also, a bitline may be shared across the transistors of the multi-stack of transistors with each transistor coupled to a different wordline.

Described herein are various implementations of a device having a memory architecture with a multi-stack of transistors arranged in a multi-bitcell stack configuration. Also, a first wordline may be shared across a first set of transistors of the multi-stack of transistors with each transistor in the first set of transistors coupled to a first set of shared bitlines. Also, a second wordline may be shared across a second set of transistors of the multi-stack of transistors with each transistor in the second set of transistors coupled to a second set of shared bitlines.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, specific features and acts described above are disclosed as example forms of implementing the claims.

What is claimed is:

1. A device comprising:
a memory architecture having a multi-stack of transistors arranged in a multi-bitcell stack configuration, and wherein a wordline is shared across the transistors of the multi-stack of transistors with each transistor coupled to a different bitline, wherein a global wordline is coupled to the wordline such that the global wordline is shared across the transistors.

2. The device of claim 1, wherein the transistors in the multi-stack of transistors are formed in the memory architecture as a three-dimensional (3D) memory structure.

3. The device of claim 1, wherein the multi-bitcell stack configuration has at least two transistors in the multi-stack of transistors.

4. The device of claim 1, wherein the multi-bitcell stack configuration has at least four transistors in the multi-stack of transistors.

5. The device of claim 1, wherein each transistor is coupled to ground or to its corresponding bitline of each different bitline.

6. The device of claim 1, wherein each different bitline is separated by an insulator.

7. The device of claim 1, wherein a global bitline is coupled to the different bitlines through local bitlines.

8. A device comprising:
a memory architecture having a multi-stack of transistors arranged in a multi-bitcell stack configuration, and wherein a bitline is shared across the transistors of the multi-stack of transistors with each transistor coupled to a different wordline.

9. The device of claim 8, wherein the transistors in the multi-stack of transistors are formed in the memory architecture as a three-dimensional (3D) memory structure.

10. The device of claim 8, wherein the multi-bitcell stack configuration has at least two transistors in the multi-stack of transistors.

11. The device of claim 8, wherein the multi-bitcell stack configuration has at least four transistors in the multi-stack of transistors.

12. The device of claim 8, wherein each transistor is coupled to ground or to its corresponding bitline that is shared across the transistors.

13. The device of claim 8, wherein each different wordline is separated by an insulator.

14. The device of claim 8, wherein a different global wordline is coupled to each different wordline.

15. A device comprising:
a memory architecture having a multi-stack of transistors arranged in a multi-bitcell stack configuration, and wherein a first wordline is shared across a first set of transistors of the multi-stack of transistors with each transistor in the first set of transistors coupled to a first set of shared bitlines, and wherein a second wordline is shared across a second set of transistors of the multi-stack of transistors with each transistor in the second set of transistors coupled to a second set of shared bitlines.

16. The device of claim 15, wherein the transistors in the multi-stack of transistors are formed in the memory architecture as a three-dimensional (3D) memory structure.

17. The device of claim 15, wherein the multi-bitcell stack configuration has at least four transistors in the multi-stack of transistors.

18. The device of claim 15, wherein each transistor is coupled to ground or to its corresponding bitline of the first set of bitlines and the second set of bitlines.

19. The device of claim 15, wherein the first wordline and the second wordline are separated by an insulator.

20. The device of claim 15, wherein a first global wordline is coupled to the first wordline such that the first global wordline is shared across the first set of transistors, and wherein a second global wordline is coupled to the second wordline such that the second global wordline is shared across the second set of transistors.

* * * * *